United States Patent
Ha et al.

(10) Patent No.: US 9,190,421 B2
(45) Date of Patent: Nov. 17, 2015

(54) DISPLAY DEVICE AND FABRICATION METHOD THEREOF

(75) Inventors: Jong-Moo Ha, Gyeongsangbuk-Do (KR); Tae-Yong Jung, Gyeongsangbuk-Do (KR); Jong-Hyun Park, Busan (KR); Yang-Ho Cho, Busan (KR); Se-Ho Kim, Gyeongsangbuk-Do (KR); Young-Chul Kwon, Gyeongsangbuk-Do (KR); Sung-Hyun Kim, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 332 days.

(21) Appl. No.: 13/572,860

(22) Filed: Aug. 13, 2012

(65) Prior Publication Data
US 2013/0044044 A1   Feb. 21, 2013

(30) Foreign Application Priority Data

Aug. 18, 2011 (KR) .................. 10-2011-0082455
Nov. 24, 2011 (KR) .................. 10-2011-0123755

(51) Int. Cl.
*H01L 27/12* (2006.01)
*H01L 27/32* (2006.01)
*G02F 1/1345* (2006.01)
*G02F 1/1362* (2006.01)

(52) U.S. Cl.
CPC .......... *H01L 27/124* (2013.01); *G02F 1/13452* (2013.01); *G02F 1/136286* (2013.01); *H01L 27/3276* (2013.01); *H01L 27/3279* (2013.01)

(58) Field of Classification Search
CPC ............. G09G 5/00; G09G 3/30; G09G 3/32; H01L 33/62; G06F 3/038
See application file for complete search history.

(56) References Cited

U.S. PATENT DOCUMENTS

| | | |
|---|---|---|
| 2002/0097364 A1 | 7/2002 | Kwon et al. |
| 2004/0051836 A1 | 3/2004 | Jung et al. |
| 2010/0033664 A1* | 2/2010 | Lee .............................. 349/139 |

(Continued)

FOREIGN PATENT DOCUMENTS

| | | |
|---|---|---|
| CN | 1495477 A | 5/2004 |
| CN | 1584712 A | 2/2005 |

(Continued)

OTHER PUBLICATIONS

Office Action dated Sep. 26, 2014, issued by the State Intellectual Property Office of China in Chinese Patent Application No. 201210290830.3.

(Continued)

*Primary Examiner* — Michael Faragalla
(74) *Attorney, Agent, or Firm* — Morgan, Lewis & Bockius LLP

(57) ABSTRACT

A display device and a fabrication method thereof are provided. In a dual-link structure for a narrow bezel, first link wirings are formed on the same layer that the gate lines are formed and second link wirings are formed on the same layer that the data lines are formed. The first link wirings and the second link wirings are formed in a non-display area. Or auxiliary link wirings are further formed over the first link wirings and the second link wirings respectively. Or the first link wiring and second link wiring are divided two pieces of sub-link wirings. The sub-link wirings consisting the one link wiring are connected respectively and are formed on the different layer, whereby a defective image due to a difference in resistance between neighboring link wirings can be improved.

26 Claims, 16 Drawing Sheets

(56) References Cited

U.S. PATENT DOCUMENTS

2011/0273410 A1* 11/2011 Park et al. .................. 345/204
2012/0212465 A1* 8/2012 White et al. ................. 345/205

FOREIGN PATENT DOCUMENTS

| | | |
|---|---|---|
| CN | 101494226 A | 7/2009 |
| CN | 101644864 A | 2/2010 |
| JP | 2005-165051 A | 6/2005 |
| JP | 2009-86402 A | 4/2009 |
| KR | 10-2006-0092712 A | 8/2006 |
| KR | 10-2011-0036456 A | 4/2011 |

OTHER PUBLICATIONS

Office Action dated Jun. 22, 2015, issued by the Korean Intellectual Property Office in Korean Patent Application No. 10-2011-0123755.

* cited by examiner

DISPLAY DEVICE AND FABRICATION METHOD THEREOF

1. FIELD OF THE INVENTION

The present invention relates to a display device and a fabrication method thereof, and more particularly, to a display device employing a dual-link structure for implementing a narrow bezel and a fabrication method thereof.

2. DESCRIPTION OF THE RELATED ART

As the information technology is advancing, a market of display devices as mediums connecting users and information is extending. Thus, the use of display devices such as a liquid crystal display (LCD), an organic light emitting display (OLED), and a plasma display panel (PDP), and the like, is on the rise.

Such display devices are used for various purposes in TVs, videos, computers, cellular phones, and the like.

Hereinafter, a general display device in prior art will be described in detail with reference to the accompanying drawings. FIG. 1 is a plan view schematically illustrating a general display device of prior art. And FIG. 2 is an enlarged plan view of a portion 'E' of the display device illustrated in FIG. 1.

With reference to FIGS. 1 and 2, the display device 10 as described above, such as an LCD or an OLED, includes a display unit 20 in which a plurality of sub-pixels (not shown) disposed in a matrix form, a non-display unit surrounding the display unit 20, and a driving unit for driving the sub-pixels.

The driving unit includes a timing driving unit (not shown), a data driving unit 30, and the like. The data driving unit 30 is formed on a panel of the display device 10 and the timing driving unit is formed on a flexible circuit board (not shown) connected to the panel.

The general display device 10 configured as described above requires link wirings 26 by the number corresponding to gate lines of the plurality of sub-pixels to apply gate signals to the respective gate lines. Thus, in the general display device 10, the number of link wirings 26 is increased according to the number of the gate lines required for increasing resolution, and thus, a width (W) of a bezel of the display device 10 is also increased. Thus, a scheme for improving the problem should be sought.

SUMMARY OF THE INVENTION

An aspect of the present invention provides a display device capable of implementing a narrow bezel by applying a dual link structure, and a fabrication method thereof.

Another aspect of the present invention provides a display device capable of reducing a difference in resistance between neighboring link wirings by applying a dual link structure, and a fabrication method thereof.

According to an aspect of the present invention, there is provided a display device including: a first substrate including a display unit and a non-display unit surrounding the display unit; a driving unit; wherein the first substrate further comprises: a plurality of thin film transistors formed in the display unit; and a plurality of first link wirings and a plurality of second link wirings alternately formed in the non-display unit, for applying gate signals from the driving unit to respective gate lines in the display unit; and a second substrate attached to the first substrate, wherein the first link wiring is adjacent to the second link wiring, and the first link wiring is formed on a first layer, the second link wiring is formed on a second layer different from the first layer.

The gate lines are formed on the first layer, and data lines are formed on the second layer. The first layer may be an array substrate. When the buffer layer is formed on the array substrate, the first layer may be the buffer layer. The second layer may be a gate insulating layer.

The display device may further include: a first connection electrode electrically connecting the first link wiring and the gate line; and a second connection electrode electrically connecting the second link wiring and the gate line.

The first connection electrode and the second connection electrode may be made of same material.

The first link wiring may further comprise a first auxiliary link wiring and the second link wiring may further comprise a second auxiliary link wiring.

The first auxiliary link wiring may be parallel with the first link wiring and formed over the first link wiring, and the second auxiliary link wiring may be parallel with the second link wiring and formed over the second link wiring.

The first auxiliary link wiring may be formed right above the first link wiring, and the second auxiliary link wiring may be formed right above the second link wiring.

The first auxiliary link wiring and the second auxiliary link wiring may be formed on the same layer. For example, the first auxiliary link wiring and the second auxiliary link wiring are formed on a passivation layer covering the data lines.

A width of the first auxiliary link wiring may be narrower than a width of the first link wiring, and a width of the second auxiliary link wiring may be narrower than a width of the second link wiring.

The first auxiliary link wiring and the second auxiliary link wiring may be formed of a transparent conductive material.

The first auxiliary link wiring and the second auxiliary link wiring may be formed on the same layer that a pixel electrode is formed.

The first auxiliary link wiring and the second auxiliary link wiring may be formed on the same layer that the first connection electrode and the second connection electrode are formed.

The first link wiring and the first auxiliary link wiring may be connected each other electrically, and the second link wiring and the second auxiliary link wiring may be connected each other electrically.

The first link wiring may comprise a first lower sub-link wiring formed on the first layer and a first upper sub-link wiring formed on the second layer, and the second link wiring comprises a second lower sub-link wiring formed on the first layer and a second upper sub-link wiring formed on the second layer.

The first lower sub-link wiring and the first upper sub-link wiring may be connected by a third connection electrode, and the second lower sub-link wiring and the second upper sub-link wiring may be connected by a forth connection electrode.

The first lower sub-link wiring and the second upper sub-link wiring may be adjacent to each other and alternately formed, and the first upper sub-link wiring and the second lower sub-link wiring may be adjacent to each other and alternately formed.

The first lower sub-link wiring and the second lower sub-link wiring may be formed on the same layer, for example, buffer layer or array substrate. And the first upper sub-link wiring and second upper sub-link wiring may be formed on the same layer, for example, gate insulating layer.

According to another aspect of the present invention, there is provided a method for manufacturing a display device, including: providing a first substrate including a display unit and an non-display unit surrounding the display unit; forming gate lines in the display unit and a plurality of first link wirings in the non-display unit; forming a gate insulating layer covering the gate lines and the first link wiring; forming an active layer of a thin film transistor; forming data lines, source and drain electrodes in the display unit and a plurality of second link wirings in the non-display unit; forming a passivation layer covering the data lines, the source and drain electrodes and the second link wiring; forming contact holes exposing the gate lines, the first link wiring, the second link wiring and the drain electrodes; forming pixel electrodes connecting to the drain electrodes; providing a second substrate; and attaching the first substrate and the second substrate.

The first link wiring and the second link wiring may be alternately formed in the non-display unit, and the first link wiring is adjacent to the second link wiring.

The step of forming the pixel electrodes connecting to the drain electrodes further including; forming connection electrodes connecting the first link wiring to the gate lines and the second link wiring to the gate lines respectively;

The step of forming the pixel electrodes connecting to the drain electrodes further comprising; forming auxiliary link wirings over the first link wiring and the second link wiring respectively.

The auxiliary link wirings are formed of a transparent conductive material that a pixel electrode is formed of.

According to another aspect of the present invention, there is provided a method for manufacturing a display device, including: providing a first and a second substrates, wherein the first substrate includes a display unit and an non-display unit surrounding the display unit; providing a driving unit; forming gate lines in the display unit and a plurality of first lower sub-link wirings and a plurality of second lower sub-link wirings in the non-display unit; forming a gate insulating layer covering the gate lines, the first lower sub-link wirings and the second lower sub-link wirings; forming an active layer of a thin film transistor; forming data lines, source and drain electrodes in the display unit and a plurality of first upper sub-link wirings and a plurality of second upper sub-link wirings in the non-display unit; forming a passivation layer covering the data lines, the source and drain electrodes, the first upper sub-link wirings and the second upper sub-link wirings; forming contact holes exposing the gate lines, the first lower sub-link wirings, second lower sub-link wirings, the first upper sub-link wirings and the second upper sub-link wirings; forming pixel electrodes connecting to the drain electrodes and connection electrodes connecting the corresponding gate lines to the first upper sub-link wirings respectively, the corresponding gate lines to the second lower link-wirings respectively, the first lower sub-link wirings to the first upper sub-link wirings respectively and the second lower sub-link wirings to the second upper sub-link wirings respectively; and attaching the first substrate and the second substrate.

The first lower sub-link wirings and the second lower sub-link wirings may be isolated each other on the same layer.

The first upper sub-link wirings and the second upper sub-link wirings may be isolated each other on the same layer.

The first lower sub-link wiring and the second upper sub-link wiring may be adjacent to each other and alternately formed, and the first upper sub-link wiring and the second lower sub-link wiring may be adjacent to each other and alternately formed.

The foregoing and other objects, features, aspects and advantages of the present invention will become more apparent from the following detailed description of the present invention when taken in conjunction with the accompanying drawings.

DETAILED DESCRIPTION OF THE INVENTION

A display device and a fabrication method thereof according to embodiments of the present invention will be described in detail with reference to the accompanying drawings.

Figure 1:
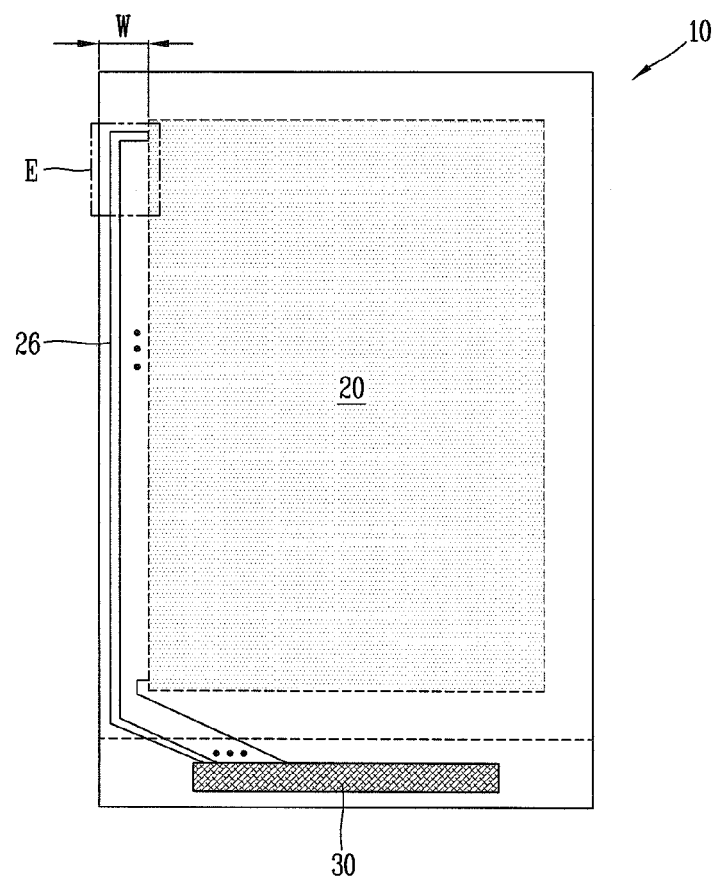
FIG. 1 is a plan view schematically showing a general display device.
Figure 2:
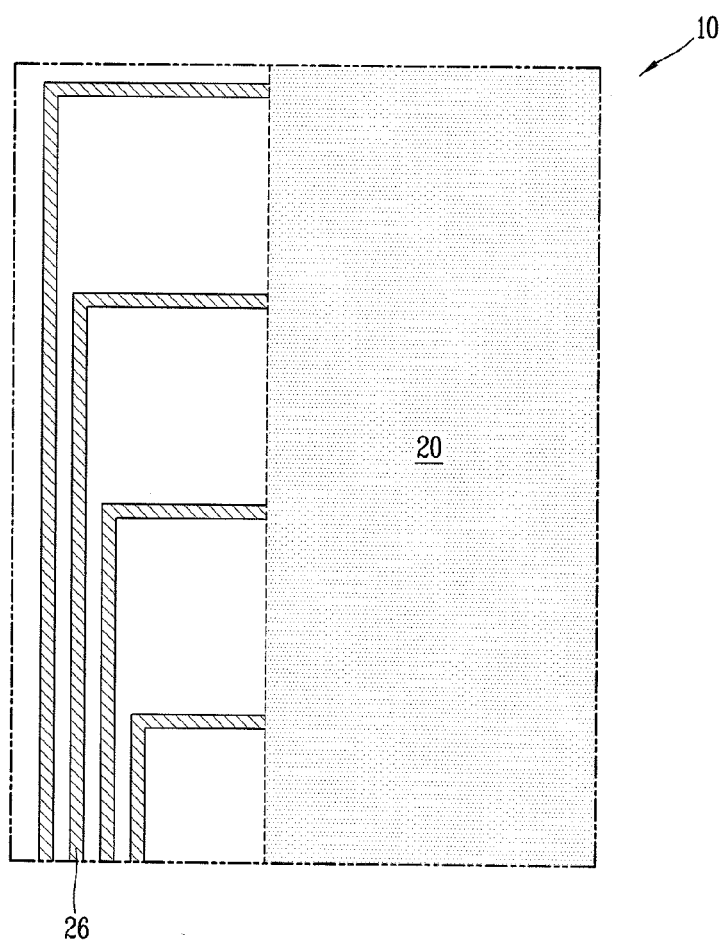
FIG. 2 is an enlarged plan view showing a portion of the display device illustrated in FIG. 1.
Figure 3:
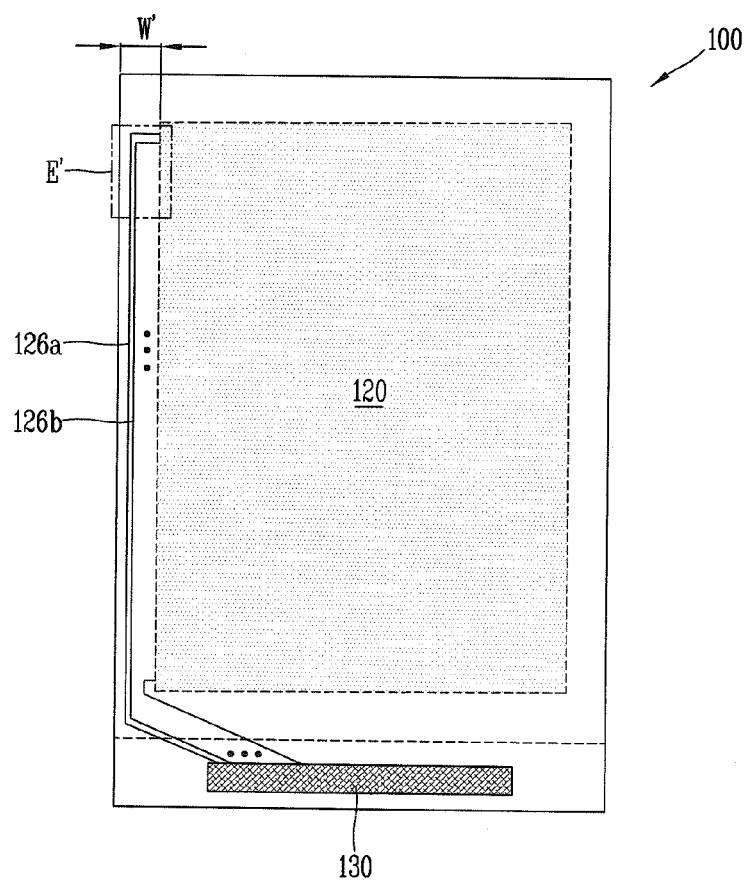
FIG. 3 is a plan view schematically showing a display device according to a first embodiment of the present invention.

FIG. 3 is a plan view schematically showing a display device according to a first embodiment of the present invention.

Figure 4:
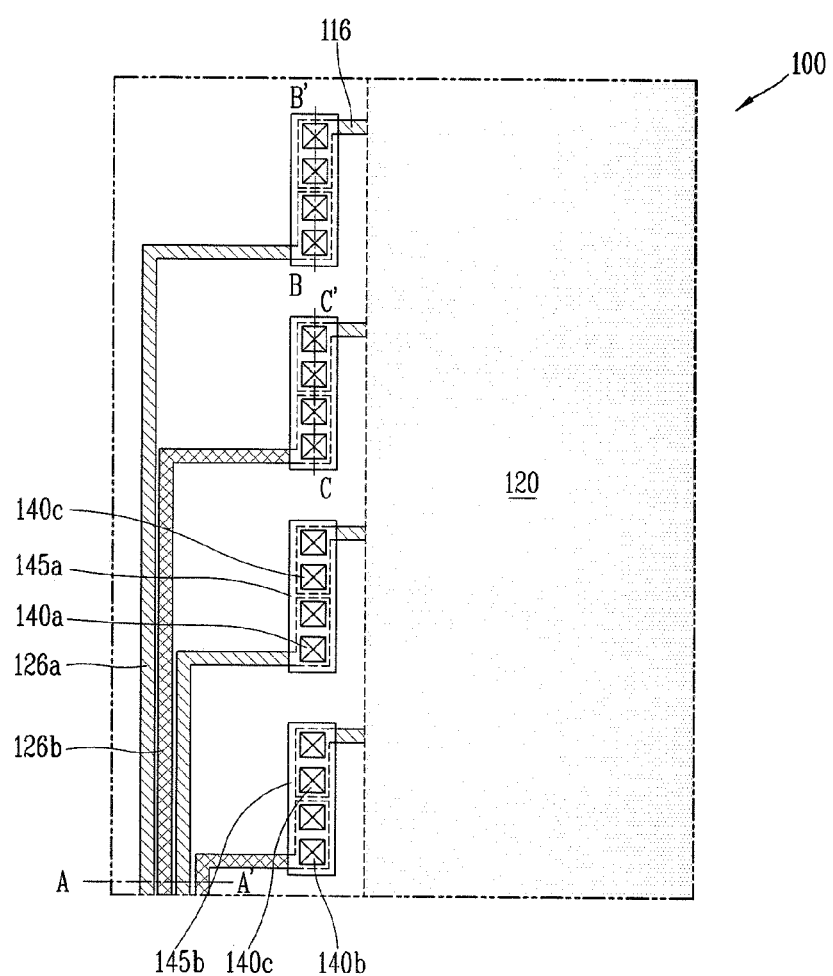
FIG. 4 is an enlarged plan view showing a portion of the display device illustrated in FIG. 3 according to the first embodiment of the present invention.

Also, FIG. 4 is an enlarged plan view showing a portion of the display device illustrated in FIG. 3 according to the first embodiment of the present invention, in which a portion E' of a link unit is enlarged to be illustrated.

Figure 5A:
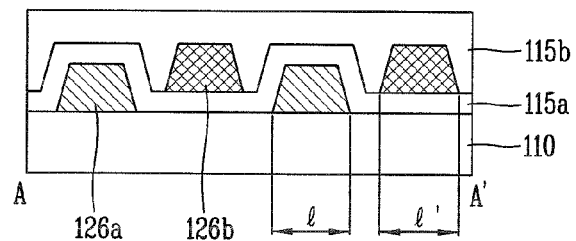
FIGS. 5A, 5B and 5C are views schematically respectively showing sections of a link unit taken along lines A-A', B-B' and C-C' in the display device illustrated in FIG. 4 according to the first embodiment of the present invention.
Figure 5B:
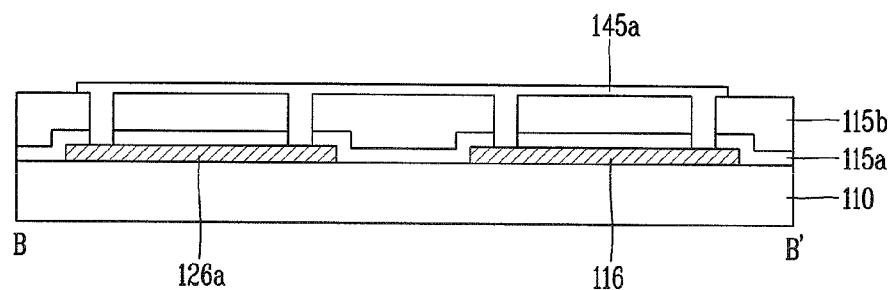
Figure 5C:
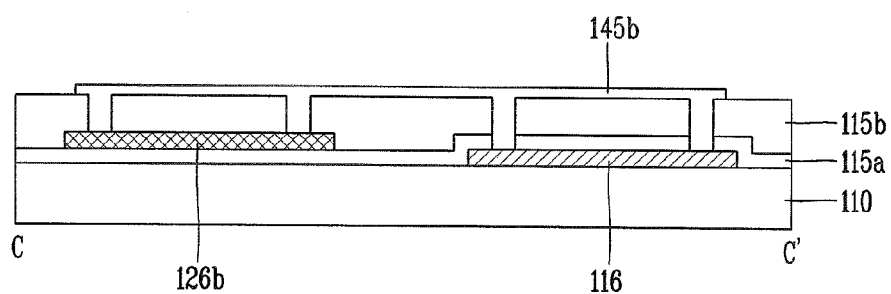

FIGS. 5A, 5B and 5C are views schematically respectively showing sections of a link unit taken along lines A-A', B-B' and C-C' in the display device illustrated in FIG. 4 according to the first embodiment of the present invention.

With reference to FIGS. 3 to 5A, 5B and 5C, a display device 100 according to a first embodiment of the present invention includes a display unit 120 in which a plurality of sub-pixels (not shown) disposed in a matrix form, a non-display unit surrounding the display unit 120, and a driving unit for driving the sub-pixels.

Here, the driving unit includes a timing driving unit (not shown), a data driving unit 130, and the like. Here, the data driving unit 130 is formed on the panel of the display device 100, and the timing driving unit may be formed on a flexible circuit board (not shown). However, the present invention is not limited thereto.

Here, the display device 100 may include a liquid crystal display (LCD) or an organic light emitting display device.

When an LCD is taken as an example of the display device 100, although not shown in the drawings, the panel of the display device 100 may be comprised of a color filter substrate as a first substrate, an array substrate 110 as a second substrate, and a liquid crystal layer formed between the color filter substrate and the array substrate 110.

Here, the color filter includes color filters comprised of red, green, and blue sub-color filters, black matrices demarcating the sub-color filters and blocking light transmitted through the liquid crystal layer, and an overcoat layer formed at an upper portion of the color filters and the black matrices.

Gate lines and data lines defining unit pixel regions are formed to be arranged vertically and horizontally on the array substrate 110, and a thin film transistor as a switching element, may be formed at each of the unit pixel regions, e.g., thin film transistor (TFT) regions, where the gate lines and the data lines cross each other.

Here, the TFT includes a gate electrode connected to the gate line, a source electrode connected to the data line, and a drain electrode connected to the pixel electrode. Also, the TFT includes a gate insulating layer 115a for insulating the gate electrode and the source/drain electrodes, and an active layer that forms a conductive channel between the source electrode and the drain electrode. Herein and hereinafter, "source/drain electrodes" refer to "source and drain electrodes". Also, the TFT includes a protection layer 115b for insulating the source/drain electrodes and the pixel electrode.

The display device 100 according to the first embodiment of the present invention requires a number of link wirings 126a and 126b corresponding to gate lines in order to apply gate signals to the respective gate lines.

Here, the display device 100 according to the first embodiment of the present invention employs a dual link structure in which a plurality of link wirings 126a and 126b are alternately formed on the different layers respectively, so the same number of link wirings 126a and 126b can be arranged in the link unit with a total width smaller than that of the prior art, thus reducing a bezel with W' of the display unit 100. Namely, in the first embodiment of the present invention, in comparison to the prior art in which the link wirings are formed on the same layer, the first link wiring 126a and the second link wiring 126b are formed on the different layers, specifically, on the first layer that gate lines are formed and the second layer that the data lines are formed respectively, reducing a space between the link wirings 126a and 126b, so the same number of link wirings 126a and 126b can be arranged in the link unit with a total width smaller than that of the prior art. The first layer may be a substrate that the gate lines are formed on and the second layer may be a gate insulating layer that the data lines are formed on. If the gate wiring layer is defined as space that gate lines are formed in and the data wiring layer is defined as space that the data lines are formed in, the first link wiring 126a may construct a part of the gate wiring layer comprising the gate lines and the second link wiring 126b may construct a part of the data wiring layer comprising the data lines.

That is, the gate wiring layer is the space between the first substrate that the gate lines are formed on and the gate insulating layer covering the gate lines, and the data wiring layer is the space between the gate insulating layer that the data lines are formed on and the passivation layer covering the data lines.

Also, an interval between the first link wiring 126a and the second link wiring 126b formed on each of the first layer and the second layer can be minimized without causing a short circuit therebetween although an overlay shift occurs slightly while the process is being performed.

Since the display device 100 according to the first embodiment of the present invention employs the dual-link structure, contact holes 140b and 140c for connecting the second link wiring 126b to the gate line in the link unit 116 (here, the gate line in the link unit 116 refers to a gate line extending from a display unit to the non-display unit) are required. Namely, the second link wiring 126b formed on the gate insulating layer is electrically connected to a second connection electrode 145b, which is formed on the passivation layer covering the data lines, through the second contact hole 140b and the second connection electrode 145b is also electrically connected to the gate line in the link unit 116 through the third contact hole 140c, and accordingly, the second link wiring 126b formed on the gate insulating layer is connected to the corresponding gate line in the link unit 116.

Herein the first link wiring 126a formed on the substrate (when the buffer layer is formed on the substrate, the first link wiring 126a is formed on the buffer layer) is also electrically connected to the first connection electrode 145a, which is also formed on the passivation layer that the second connection electrode 145b is formed, through the first contact hole 140a in the same manner, and as the first connection electrode 145a is electrically connected to the gate line in the link unit 116 through the third contact hole 140c, the first link wiring 126a is also connected to the corresponding gate line in the link unit 116.

The first link wiring 126a and the second link wiring 126b are alternately formed according to the order of the gate lines in the link unit 116, and in this case, for example, the odd numbered gate lines in the link unit 116 may be connected to the first link wiring 126a and the even numbered gate lines in the link unit 116 may be connected to the second link wiring 126b. However, the present invention is not limited thereto.

The first and second connection electrodes 145a and 145b may be made of a transparent conductive material such as indium tin oxide (ITO) or indium zinc oxide (IZO). The first contact hole 140a, the second contact hole 140b, and the third contact hole 140c may be formed to penetrate the first link wiring 126a, the second link wiring 126b, and the gate line in the link unit 116 respectively.

Meanwhile, in the dual-link structure according to the first embodiment of the present invention, the first link wiring 126a on the first layer and the second link wiring 126b on the second layer are not simultaneously etched, so there may be a difference (l≠l') between a critical dimension l (CD l) of the first link wiring 126a and a critical dimension l' (CD l') of the second link wiring 126b. Herein the critical dimension means the width of wiring. A difference in resistance resulting from a difference in the CD of each wiring may cause a dim type defect which dimply appears horizontally on the screen of the display device 100.

In particular, the worldwide mobile display markets are advancing toward having high resolution and a narrow bezel, and accordingly, the width of a bezel reduced and the number of link wirings to be patterned therein is increased. Since a larger number of link wirings than that of the prior art should be disposed within a limited bezel width, circuits should be necessarily designed to have fine pitches such that the CD of the link wiring is reduced and the space between the link wirings is also reduced. The reduction in the CD inevitable in the designing of fine pitches causes distortion of an image due to a difference in resistance between link wirings. Also, in the dual-link structure, the CD of a link wiring in the data wiring layer deposited later is changed according to the CD of the link wiring in the gate wiring layer which is first deposited.

Thus, in a display device according to a second embodiment of the present invention, an additional wiring is formed over the first link wiring and the second link wiring in parallel respectively to reduce a difference in resistance. This will be described in detail with reference to the accompanying drawings.

Figure 6:
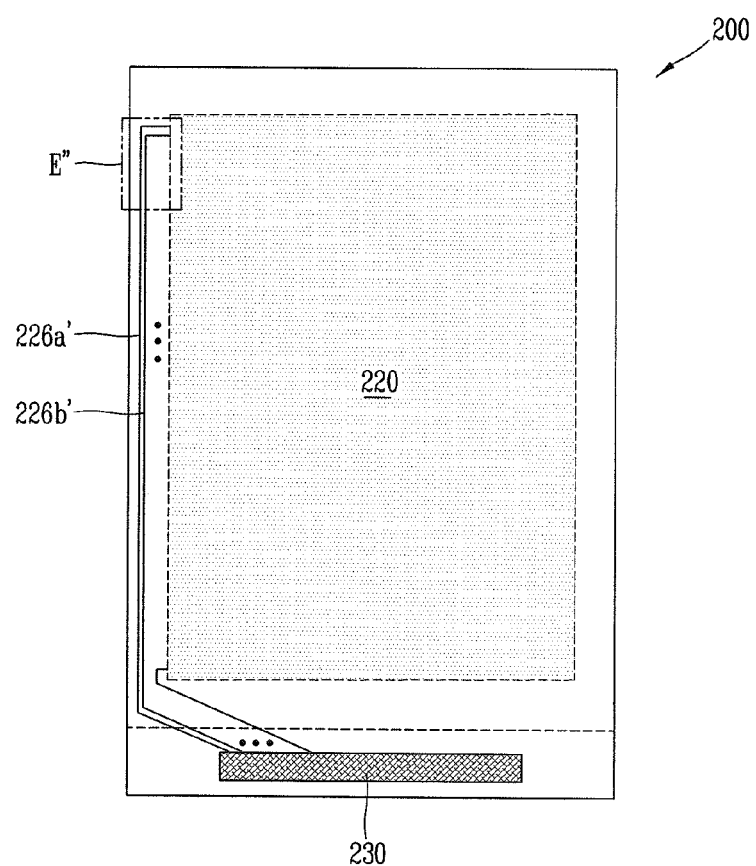
FIG. 6 is a plan view schematically showing a display device according to a second embodiment of the present invention.

FIG. 6 is a plan view schematically showing a display device according to a second embodiment of the present invention.

Figure 7:
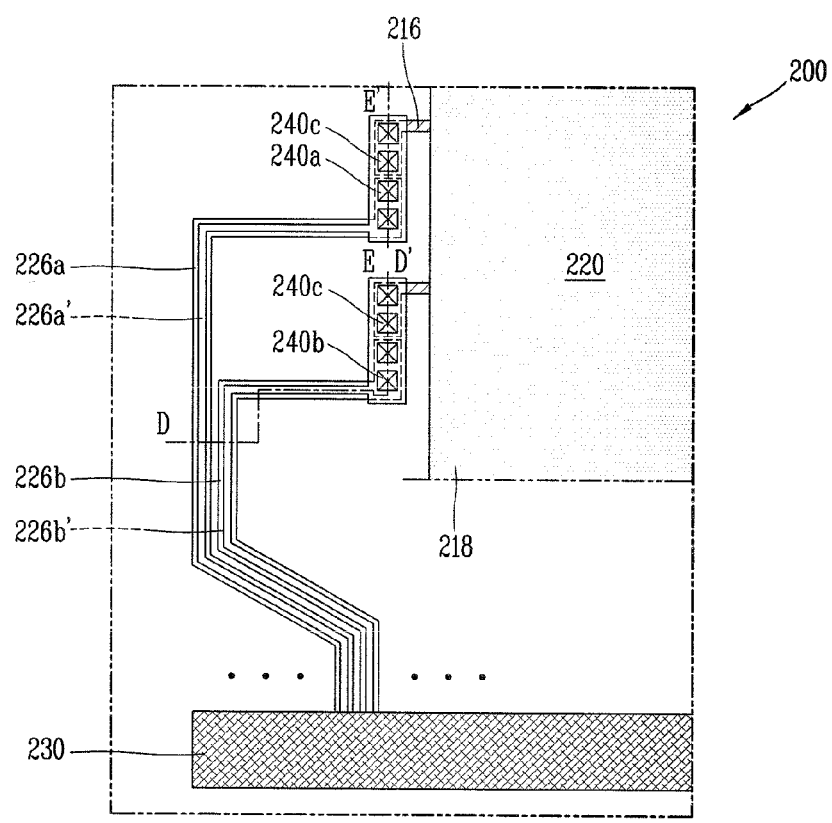
FIG. 7 is an enlarged plan view showing a portion of the display device illustrated in FIG. 6 according to the second embodiment of the present invention.

Also, FIG. 7 is an enlarged plan view showing a portion of the display device illustrated in FIG. 6 according to the second embodiment of the present invention, in which a portion E" of the link unit is enlarged to be illustrated.

Figure 8A:
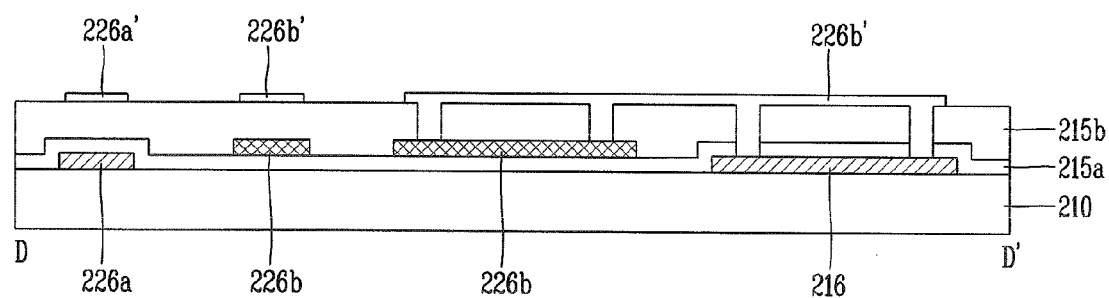
FIGS. 8A and 8B are views schematically respectively showing sections of an array substrate taken along lines D-D' and E-E' in the display device illustrated in FIG. 7 according to the second embodiment of the present invention.
Figure 8B:
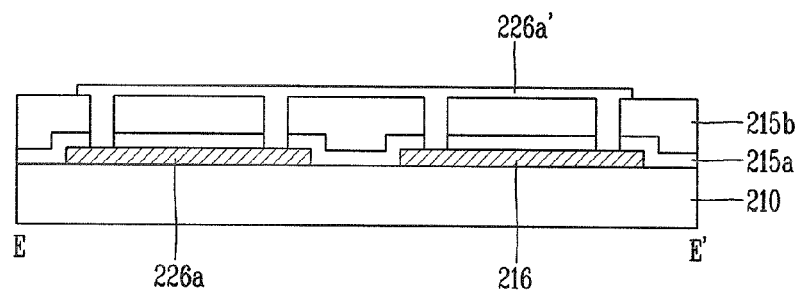

FIGS. 8A and 8B are views schematically respectively showing sections of an array substrate taken along lines D-D' and E-E' in the display device illustrated in FIG. 7 according to the second embodiment of the present invention.

With reference to FIGS. 6 to 8A and 8B, a display device 200 according to the second embodiment of the present invention includes a display unit 220 in which a plurality of sub-pixels (not shown) disposed in a matrix form, a non-display unit surrounding the display unit 220, and a driving unit for driving the sub-pixels.

The driving unit includes a timing driving unit (not shown), a data driving unit 230, a level shifter (not shown), and the like. Here, the data driving unit 230 is formed on a panel of the display device 200, and the timing driving unit may be formed on a flexible circuit board (not shown) connected to a panel or an external system substrate connected to the flexible circuit board, or the like. However, the present invention is not limited thereto and the timing driving unit may be formed together with the data driving unit 230.

The driving unit is mounted in the form of an integrated circuit (IC) on the panel, and the flexible circuit board is attached to the panel. Here, the panel and the flexible circuit board may be attached by an anisotropy conductive film (ACF).

Here, the display device 200 includes, for example, flat panel display devices such as an LCD device or an OLED display device.

When an LCD device is taken as an example of the display device 200, although not shown in detail, the panel of the display device 200 may include a color filter substrate as a first substrate, an array substrate 210 as a second substrate, and a liquid crystal layer formed between the color filter substrate and the array substrate 210.

Here, the color filter substrate may include color filters including red, green, and blue sub-color filters, black matrices demarcating the sub-color filters and blocking light which transmits through the liquid crystal layer, and an overcoat layer formed on upper portions of the color filters and the black matrices.

Gate lines and data lines arranged vertically and horizontally to define pixel regions are formed on the array substrate 210, and thin film transistors as switching elements are formed at crossing regions, namely, TFT regions, of the gate lines and the data lines.

Here, the thin film transistor includes a gate electrode connected to the gate line, a source electrode connected to the data line, and a drain electrode connected to the pixel electrode. Also, the TFT includes a gate insulating layer 215a for insulating the gate electrode and the source/drain electrodes, and an active layer for forming a conductive channel between the source and drain electrodes by a gate voltage supplied to the gate electrode. Also, the TFT includes a protection layer 215b for insulating the source/drain electrodes and the pixel electrode.

The display device 200 according to the second embodiment of the present invention configured as described above requires a number of link wirings 226a and 226b corresponding to the gate lines in order to apply gate signals to the respective gate lines of the plurality of sub-pixels.

Here, the display device 200 according to the second embodiment of the present invention employs the dual-link structure in which a plurality of the link wirings 226a and 226b are formed in the same manner as that of the first embodiment of the present invention as described above.

In particular, in the second embodiment of the present invention, additional wirings, namely, a first auxiliary link wiring 226a' and a second auxiliary wiring 226b' are formed over the first link wiring 226a and the second link wiring 226b, respectively, and connected to the first link wiring 226a and the second link wiring 226b in parallel, respectively, to reduce a difference in resistance, thereby preventing a defective image due to a difference in resistance between the first link wiring 226a in the gate wiring layer and the second link wiring 226b in the data wiring layer. Preferably, the first auxiliary link wiring is formed right above the first link wiring, and the second auxiliary link wiring is formed right above the second link wiring.

Here, the first auxiliary link wiring 226a' and the second auxiliary wiring 226b' may be made of a transparent conductive material such as indium-tin-oxide (ITO) or indium-zinc-oxide (IZO). The first auxiliary link wiring 226a' and the second auxiliary wiring 226b' may be formed on the passivation layer covering the data lines.

Like the first embodiment of the present invention, the display device 200 according to the second embodiment of the present invention requires contact holes 240b and 240c for connecting the second link wiring 226b to the gate line in the link unit 216 (here, the gate line in the link unit 216 refers to the gate line of the display unit extending toward the non-display unit). Namely, the second link wiring 226b is electrically connected to the second auxiliary link wiring 226b', which is formed over the second link wiring 226b, through the second contact hole 240b, and the second auxiliary link wiring 226b' is electrically connected to the gate line in the link unit 216 through the third contact hole 240c, and accordingly, the second link wiring 226b is connected to the corresponding gate line in the link unit 216.

In this case, in the same manner, the first link wiring 226a on the first layer is also electrically connected to the first auxiliary link wiring 226a' through the first contact hole 240a and the first auxiliary link wiring 226a' is electrically connected to the gate line in the link unit 216 through the third contact hole 240c, and accordingly, the first link wiring 226a is connected to the corresponding gate line in the link unit 216.

Meanwhile, in the data driving unit 230, the first link wiring 226a and the second link wiring 226b are respectively electrically connected to the first auxiliary link wiring 226a' and the second auxiliary link wiring 226b' of the upper layers through a fourth contact hole (not shown).

In this manner, since the first auxiliary link wiring 226a' and the second auxiliary link wiring 226b' are connected in parallel to the first link wiring 226a and the second link wiring 226b, respectively, total resistance is reduced and a difference in resistance between the first link wiring 226a and the second link wiring 226b can be alleviated.

The first link wiring 226a and the second link wiring 226b are alternately formed according to the order of the gate lines in the link unit 216, and in this case, for example, the odd numbered gate lines in the link unit 216 may be connected to the first link wiring 226a and the even numbered gate lines in the link unit 216 may be connected to the second link wiring 226b. However, the present invention is not limited thereto.

A method for fabricating the display device configured as above described will be described in detail with reference to the accompanying drawings.

FIGS. 9A to 9E are sectional views sequentially showing a process of fabricating the display device illustrated in FIG. 7 according to the second embodiment of the present invention, in which a process of fabricating an array substrate of an LCD in a link unit of the non-display unit (above figure) and the TFT region of the display unit (below figure) are taken as an example.

Figure 9A:
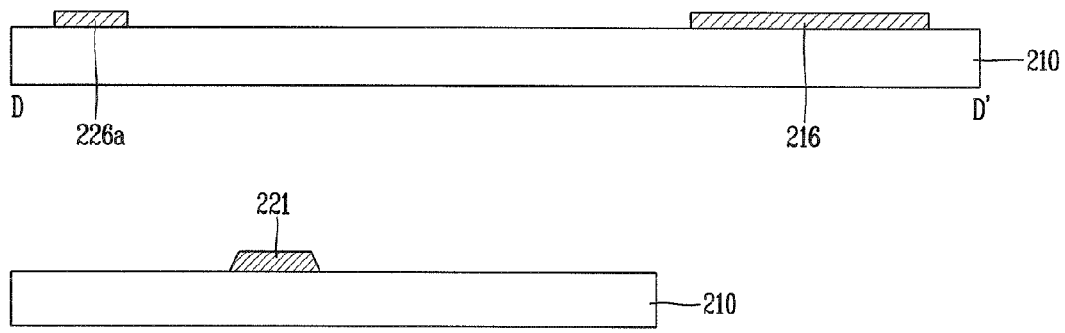
FIGS. 9A to 9E are sectional views sequentially showing a process of fabricating the display device illustrated in FIG. 7 according to the second embodiment of the present invention, in which a process of fabricating an array substrate of an LCD in a link unit of the non-display unit (above figure) and the TFT region of the display unit (below figure) are taken as an example.

As shown in FIG. 9A, a gate electrode 221 and a gate line (not shown) is formed in a display unit of the array substrate 210 made of a transparent insulating material such as glass, and the first link wiring 226a is formed in the non-display unit of the array substrate 210.

Here, the gate electrode 221, the gate line, and the first link wiring 226a are formed by depositing a first conductive film on the entire surface of the array substrate 210 and then selectively patterning the first conductive film through a photolithography process (a first masking process).

Here, the first conductive film may be made of a low-resistance opaque conductive material such as aluminum (Al), an aluminum alloy, tungsten (W), copper (Cu), chromium (Cr), molybdenum (Mo), a molybdenum alloy, or the like. Also, the first conductive film may have a multi-layer structure in which two or more low-resistance conductive materials are stacked.

Figure 9B:
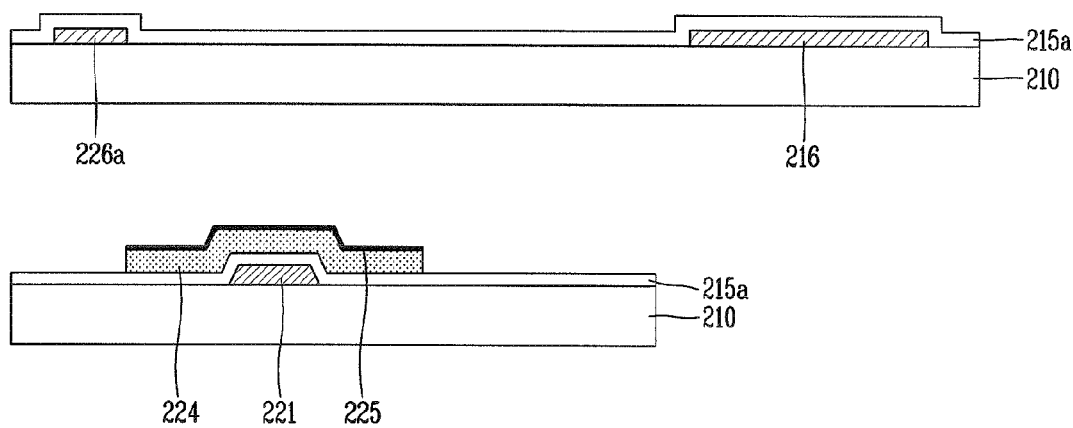

Next, as shown in FIG. 9B, a gate insulating layer 215a, an amorphous silicon thin film, and an n+ amorphous silicon thin film are sequentially formed on the entire surface of the array substrate 210 on which the gate electrode 221, the gate line, and the first link wiring 226a have been formed. And then, the amorphous silicon thin film and the n+ amorphous silicon thin film are selectively removed through a photolithography process (a second masking process).

Therefore, an active layer 224 formed of an amorphous silicon thin film is formed in the TFT region of the array substrate 210, and an n+ amorphous silicon thin film pattern 225 is formed on the active layer 224, which has been patterned to have the substantially same shape as that of the active layer 224.

Figure 9C:
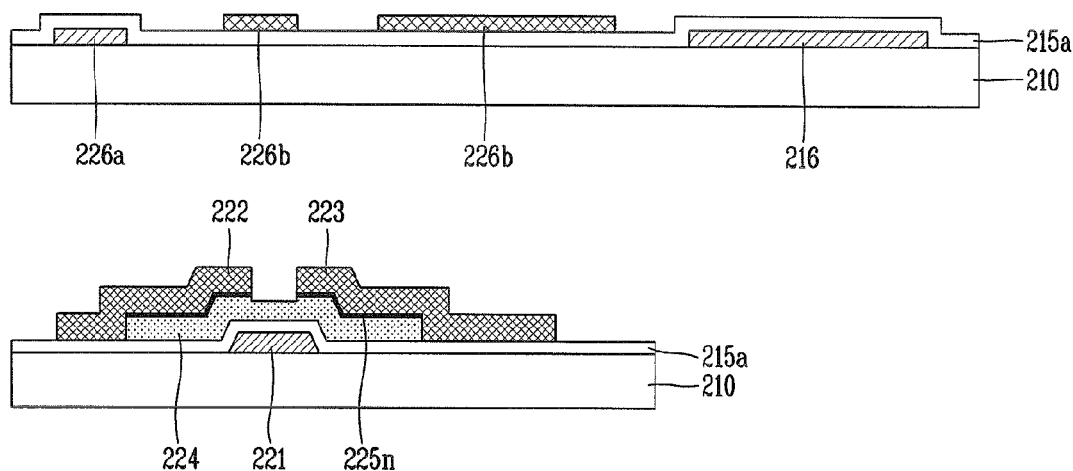

Thereafter, as shown in FIG. 9C, a second conductive film is formed on the entire surface of the array substrate 210 on which the active layer 224 and the n+ amorphous silicon thin film pattern 225 have been formed. Here, the second conductive film may be made of a low-resistance opaque conductive material such as aluminum (Al), an aluminum alloy, tungsten (W), copper (Cu), chromium (Cr), molybdenum (Mo), a molybdenum alloy, or the like. Also, the second conductive film may have a multi-layer structure in which two or more low-resistance conductive materials are stacked.

Thereafter, the n+ amorphous silicon thin film and the second conductive film are selectively removed through a photolithography (a third masking process) to form a source electrode 222 and a drain electrode 223 formed of the second conductive film at an upper portion of the active layer 224.

Meanwhile, a data line (not shown) formed of the second conductive film is formed in the data line region of the array substrate 210 and, at the same time, the second link wiring 226b formed of the second conductive film is formed in the non-display unit of the array substrate 210 through the third masking process.

The first link wiring 226a and the second link wiring 226b are alternately formed according to the order of the gate lines, and in this case, the odd numbered gate lines may be connected to the first link wiring 226a and the even numbered gate lines may be connected to the second link wiring 226b.

In this case, an ohmic-contact layer 225n formed of the n+ amorphous silicon thin film and allowing the source/drain regions of the active layer 224 and the source/drain electrodes 222 and 223 to be in ohmic-contact is formed on the active layer 224.

Figure 9D:
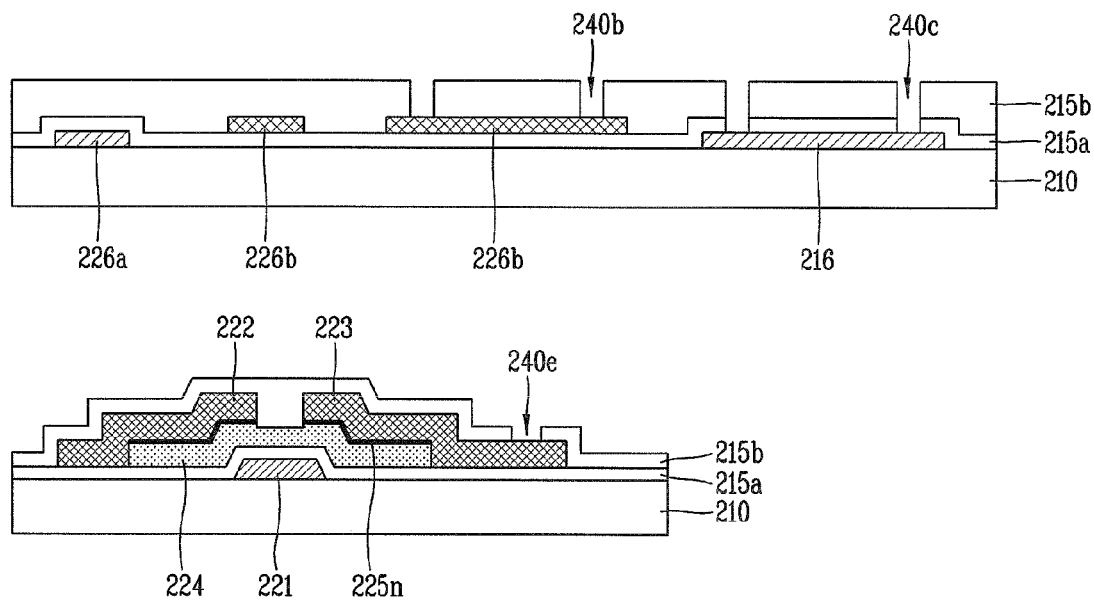

And then, as shown in FIG. 9D, a protection layer 215b is formed on the entire surface of the array substrate 210 on which the source/drain electrodes 222 and 223, the data line, and the second link wiring 226b have been formed.

Through a photolithography process (a fourth masking process), the protection layer 215b and the gate insulating layer 215a are selectively removed to form a first contact hole 240a (see FIG. 7), a second contact hole 240b, and a third contact hole 240c, exposing portions of the first link wiring 226a, the second link wiring 226b, and the gate line, respectively, in a jumping region of the array substrate 210, and a fourth contact hole (not shown), exposing portions of the first link wiring 225a and the second link wiring 225b, in the data driving unit of the array substrate 210.

Also, through the fourth masking process, a fifth contact hole 240e, exposing a portion of the drain electrode 223, is formed in the display unit of the array substrate 210.

Here, the first to the fifth contact holes may be formed such that the lower first conductive or second conductive film is exposed, or the lower first conductive film or second conductive film may be removed to expose lateral sides of the first and second conductive films.

Figure 9E:
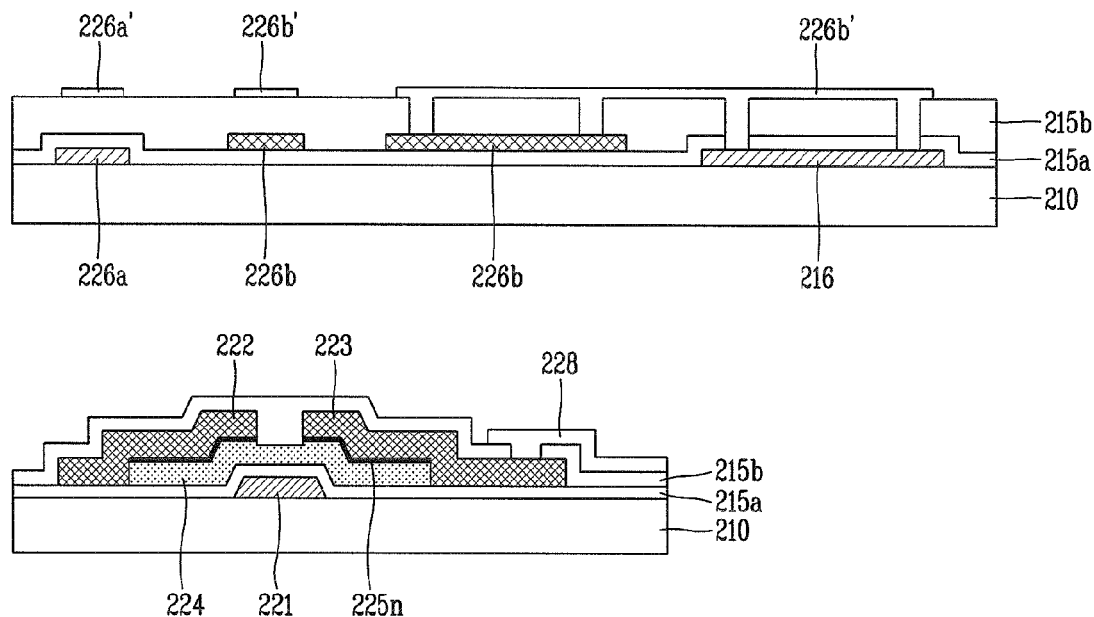

And then, as shown in FIG. 9E, a third conductive film made of a transparent conductive material is formed on the entire surface of the array substrate 210 with the protection layer 215b formed thereon, and then, selectively patterned by using a photolithography process (a fifth masking process) to form a pixel electrode 228 electrically connected to the drain electrode 223 through the fifth contact hole 240e in the pixel region of the array substrate 210.

Meanwhile, the third conductive film is selectively patterned by using the fifth masking process to form the first auxiliary link wiring 226a'. Here, the first auxiliary link wiring 226a' is formed above the first link wiring 226a, and is electrically connected to the first link wiring 226a and the gate line through the first contact hole 240a and the third contact hole 240c, respectively, and is electrically connected to the first link wiring 226a of the driving circuit unit through the fourth contact hole.

Also, by using the fifth masking process, the third conductive film is selectively patterned to form the second auxiliary link wiring 226b'. Here, the second auxiliary link wiring 226b' is formed above the second link wiring 226b, and is electrically connected to the second link wiring 226b and the gate line through the second contact hole 240b and the third contact hole 240c, respectively, and is electrically connected to the second link wiring 226b of the driving circuit unit through the fourth contact hole.

Meanwhile, display devices according to third and fourth embodiments may be fabricated such that a link wiring in the gate wiring layer and a link wiring in the data wiring layer are formed to include link wirings of different layers, respectively, through a line jumping structure, thus reducing a difference in resistance between neighboring link wirings. This will be described in detail with reference to the accompanying drawings.

Figure 10:
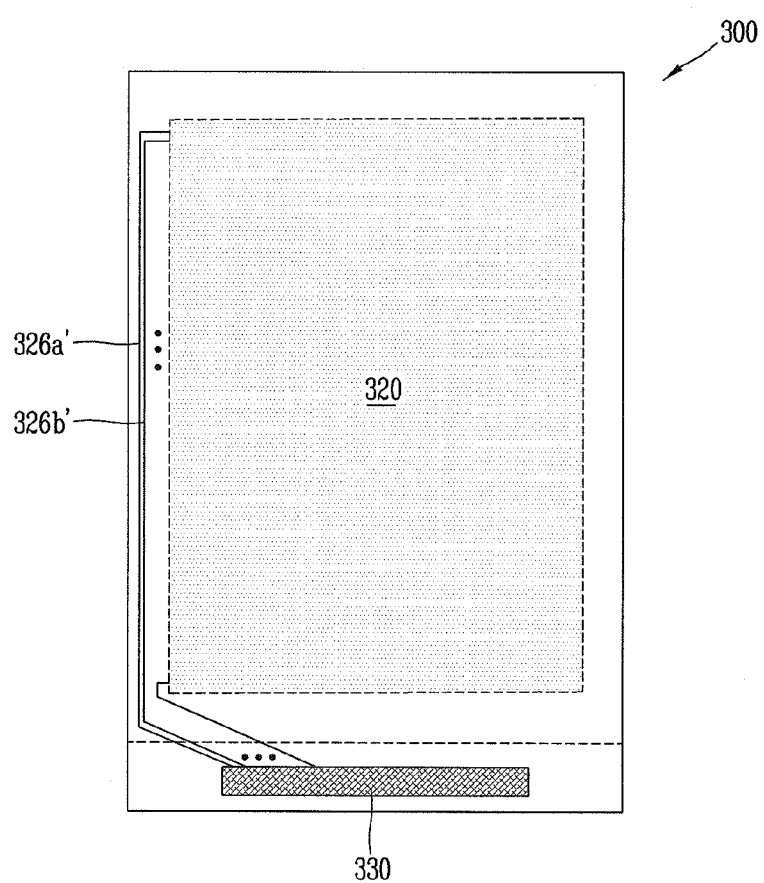
FIG. 10 is a plan view schematically showing a display device according to a third embodiment of the present invention.

FIG. 10 is a plan view schematically showing a display device according to a third embodiment of the present invention.

Figure 11:
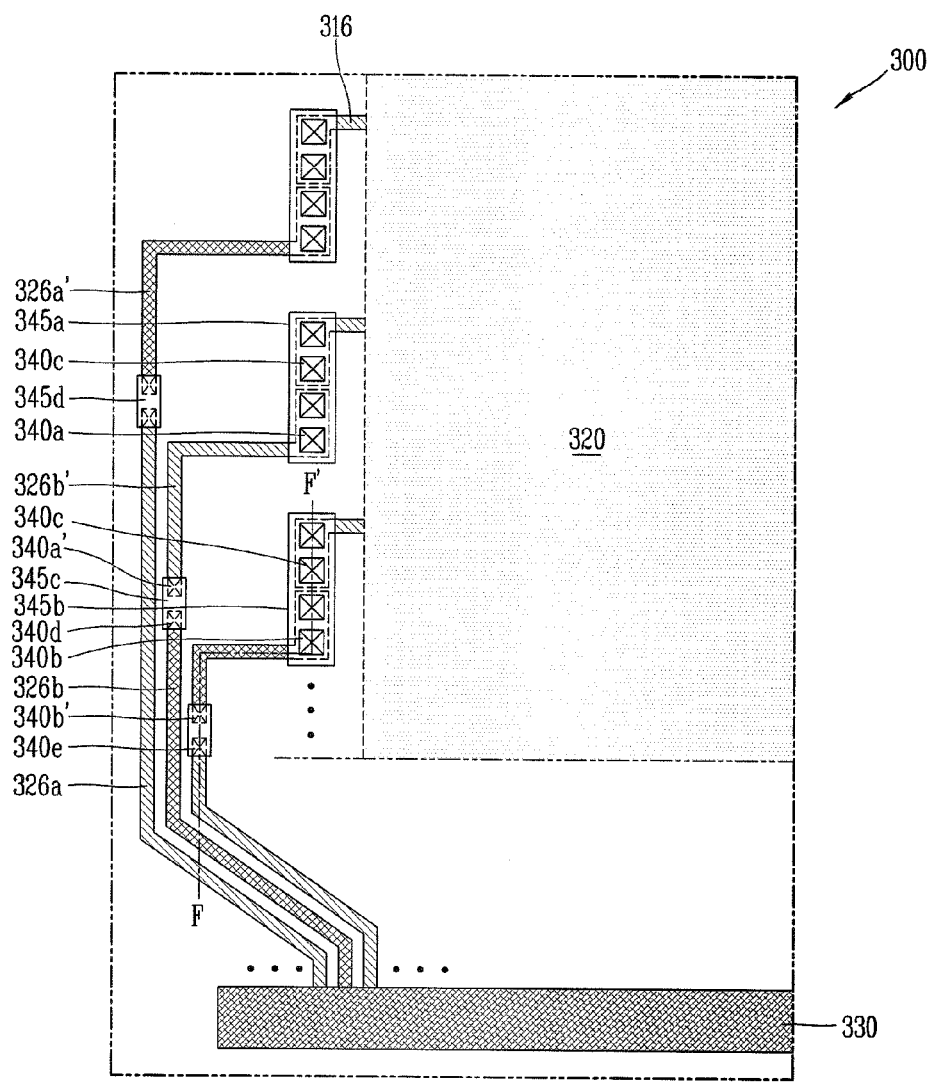
FIG. 11 is an enlarged plan view showing a portion of the display device illustrated in FIG. 10 according to the third embodiment of the present invention.

FIG. 11 is an enlarged plan view showing a portion of the display device illustrated in FIG. 10 according to the third embodiment of the present invention.

Figure 12:
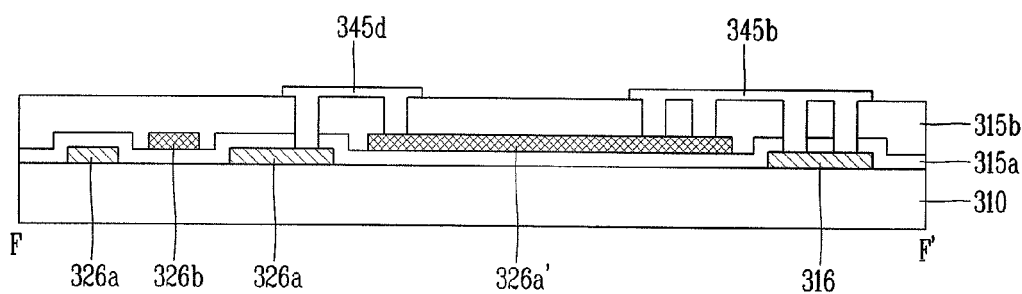
FIG. 12 is a view schematically showing a section of an array substrate taken along line F-F' in display device illustrated in FIG. 11 according to the third embodiment of the present invention.

FIG. 12 is a view schematically showing a section of an array substrate taken along line F-F' in display device illustrated in FIG. 11 according to the third embodiment of the present invention.

With reference to FIGS. 10 to 12, a display device 300 according to the third embodiment of the present invention includes a display unit 320 in which a plurality of sub-pixels (not shown) disposed in a matrix form, a non-display unit surrounding the display unit 320, and a driving unit for driving the sub-pixels.

The driving unit includes a timing driving unit (not shown), a data driving unit 330, a level shifter (not shown), and the like. Here, the data driving unit 330 is formed on a panel of the display device 300, and the timing driving unit may be formed on a flexible circuit board (not shown) connected to a panel or an external system substrate connected to the flexible circuit board, or the like. However, the present invention is not limited thereto and the timing driving unit may be formed together with the data driving unit 330.

The driving unit is mounted in the form of an integrated circuit (IC) on the panel, and the flexible circuit board is attached to the panel. Here, the panel and the flexible circuit board may be attached by an anisotropy conductive film (ACF).

Here, the display device 300 includes, for example, flat panel display devices such as an LCD device or an OLED display device.

When an LCD device is taken as an example of the display device 300, although not shown in detail, the panel of the display device 300 may include a color filter substrate as a first substrate, an array substrate 310 as a second substrate, and a liquid crystal layer formed between the color filter substrate and the array substrate 310.

Here, the color filter substrate may include color filters including red, green, and blue subcolor filters, black matrices demarcating the subcolor filters and blocking light which transmits through the liquid crystal layer, and an overcoat layer formed on upper portions of the color filters and the black matrices.

Gate lines and data lines arranged vertically and horizontally to define pixel regions are formed on the array substrate 310, and thin film transistors as switching elements are formed at crossing regions, namely, TFT regions, of the gate lines and the data lines.

Here, the thin film transistor includes a gate electrode connected to the gate line, a source electrode connected to the data line, and a drain electrode connected to the pixel electrode. Also, the TFT includes a gate insulating layer 315a for insulating the gate electrode and the source/drain electrodes, and an active layer for forming a conductive channel between the source and drain electrodes by a gate voltage supplied to the gate electrode. Also, the TFT includes a protection layer 315b for insulating the source/drain electrodes and the pixel electrode.

The display device 300 according to the third embodiment of the present invention configured as described above requires a number of link wiring sets 326a, 326a'(as a set) and 326b, 326b'(as a set) corresponding to the gate lines in order to apply gate signals to the respective gate lines of the plurality of sub-pixels.

Here, the display device 300 according to the third embodiment of the present invention employs the dual-link structure in which a plurality sets of the link wirings 326a, 326a' and a plurality sets of the link wirings 326b, 326b' are formed by using the data wiring layer and the gate wiring layer in the similar manner to that of the first embodiment of the present invention as described above. That is to say, In the case of the third embodiment of the present invention, the first link wiring set 326a, 326a' and the second link wiring set 326b, 326b' are alternately formed in the gate wiring layer and the data wiring layer such that each set is adjacent to another, so the space between the neighboring link wiring set 326a, 326a' and 326b, 326b' can be reduced, and accordingly, the same number of link wiring sets 326a, 326a' and 326b, 326b' can be arranged in a link unit with a total width smaller than that of the related art.

However, in the third embodiment of the present invention, the first link wiring set 326a, 326a' and the second link wiring set 326b, 326b' are formed to include the link wiring 326a' and 326b' of different layers from the link wiring 326a and 326b formed in, respectively, through a line jumping structure, thus preventing a defective image due to a difference in resistance between the neighboring link wiring set 326a,326a' and 326b, 326b'. Namely, the first link wiring set 326a, 326a' may include the first link wiring 326a in the gate wiring layer (i.e., a first lower sub-link wiring) and the first link wiring 326a' in the data wiring layer (i.e., a first upper sub-link wiring), and the second link wiring set 326b, 326b' may include the second link wiring 326b in the data wiring layer (i.e., a second upper sub-link wiring) and the second link wiring 326b' in the gate wiring layer (i.e., a second lower sub-link wiring).

Here, since the display device 300 according to the third embodiment employs the dual-link structure, contact holes 340b and 340c are required to connect the first upper sub-link wiring 326a' to the gate line in the link unit 316 (here, the gate line in the link unit 316 refers to the gate line of the display unit extending toward the non-display unit). Namely, the first upper sub-link wiring 326a' is electrically connected to an upper second connection electrode 345b through the second contact hole 340b, and the second connection electrode 345b is electrically connected to the lower gate line in the link unit 316 through the third contact hole 340c, and accordingly, the first upper sub-link wiring 326a' is connected to the corresponding gate line in the link unit 316. And, the first upper sub-link wiring 326a' is electrically connected to the first lower sub-link wiring 326a in a different layer, through a fourth connection electrode 345d.

In this case, in the same manner, the second lower sub-link wiring 326b' is also electrically connected to the upper first connection electrode 345a through the first contact hole 340a and the first connection electrode 345a is electrically connected to the lower gate line in the link unit 316 through the third contact hole 340c, and accordingly, the second lower sub-link wiring 326b' is connected to the corresponding gate line in the link unit 316. And, the second lower sub-link wiring 326b' is electrically connected to the second upper sub-link wiring 326b in a different layer, through the third connection electrode 345c.

Such line jumping structure is made in at least one point of the first lower and upper sub-link wiring set 326a and 326a' and at least one point of the second upper and lower sub-link wiring set 326b and 326b'. Namely, the first lower and upper sub-link wiring set 326a and 326a' and the second upper and lower sub-link wiring set 326b and 326b' may line-jump at least one time in an appropriate point in order to adjust resistance of them. For example, a line having a large CD may jump to a line having a small CD one time, and the line having a small CD may jump to a line having a large CD one time, thus allowing resistance to be corrected into a middle value.

Accordingly, deviations of resistance between the link wiring set 326a, 326a' and the link wiring set 326b, 326b' are compensated thus to improve a horizontal dim phenomenon in which colors of the respective lines on the screen are different.

The first lower and upper sub-link wiring set 326a, 326a' and the second upper and lower sub-link wiring set 326b, 326b' are alternately formed according to the order of the gate lines in the link unit 316, and in this case, for example, the odd numbered gate lines in the link unit 316 may be connected to the first lower and upper sub-link wirings 326a, 326a' and the even numbered gate lines in the link unit 316 may be connected to the second upper and lower sub-link wiring set 326b and 326b'. However, the present invention is not limited to such a connection scheme.

The first, second, third, and fourth connection electrodes 345a, 345b, 345c, 345d may be made of a transparent conductive material such as indium-tin-oxide (ITO) or indium-zinc-oxide (IZO).

A method for fabricating the display device configured as described will be described in detail with reference to the accompanying drawings.

FIGS. 13A to 13E are sectional views sequentially showing a process of fabricating the display device illustrated in FIG. 11 according to the third embodiment of the present invention, in which a process of fabricating an array substrate of an LCD in a link unit within the non-display unit (above figure) and the TFT region of the display unit (below figure) are taken as an example.

Figure 13A:
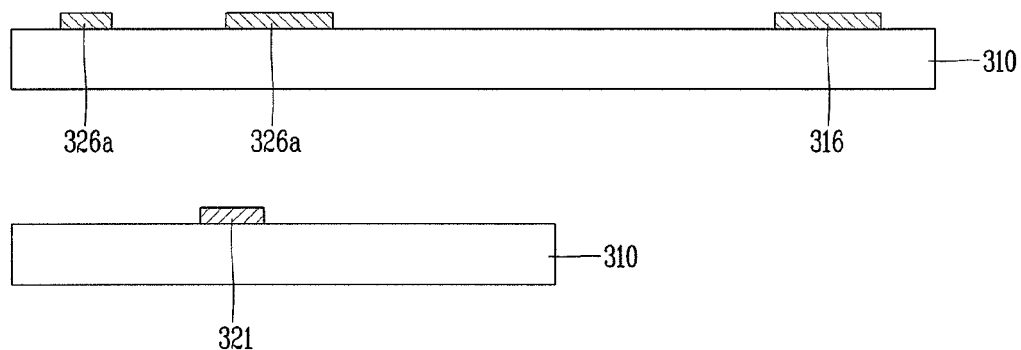
FIGS. 13A to 13E are sectional views sequentially showing a process of fabricating the display device illustrated in FIG. 11 according to the third embodiment of the present invention, in which a process of fabricating an array substrate of an LCD in a link unit within the non-display unit (above figure) and the TFT region of the display unit (below figure) are taken as an example.

As shown in FIG. 13A, a gate electrode 321 and a gate line (not shown) is formed in a display unit of the array substrate 310 made of a transparent insulating material such as glass, and the first lower sub-link wiring 326a, the second lower sub-link wiring 326b (see FIG. 11), and a gate lines in the link unit 316 are formed in the non-display unit of the array substrate 310.

Here, the gate electrode 321, the gate line, the first lower sub-link wiring 326a, the second lower sub-link wiring, and the link unit gate line 316 are formed by depositing a first conductive film on the entire surface of the array substrate 310 and then selectively patterning the first conductive film through a photolithography process (a first masking process).

Here, the first conductive film may be made of a low-resistance opaque conductive material such as aluminum (Al), an aluminum alloy, tungsten (W), copper (Cu), chromium (Cr), molybdenum (Mo), a molybdenum alloy, or the like. Also, the first conductive film may have a multi-layer structure in which two or more low-resistance conductive materials are stacked.

Figure 13B:
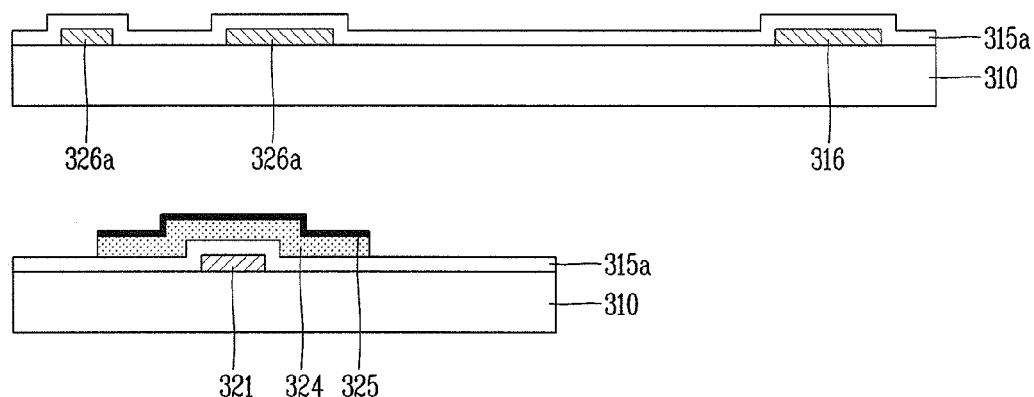

Next, as shown in FIG. 13B, a gate insulating layer 315a, an amorphous silicon thin film, and an n+ amorphous silicon thin film are sequentially formed on the entire surface of the array substrate 310 on which the gate electrode 321, the gate line, the first lower sub-link wiring 326a, the second lower sub-link wiring, and the link unit gate line 316 have been formed. And then, the amorphous silicon thin film and the n+ amorphous silicon thin film are selectively removed through a photolithography process (a second masking process). Therefore, an active layer 324 formed of an amorphous silicon thin film is formed in the TFT region of the array substrate 310, and Here, an n+ amorphous silicon thin film pattern 325 is formed on the active layer 324, which has been patterned to have the substantially same shape as that of the active layer 324.

Figure 13C:
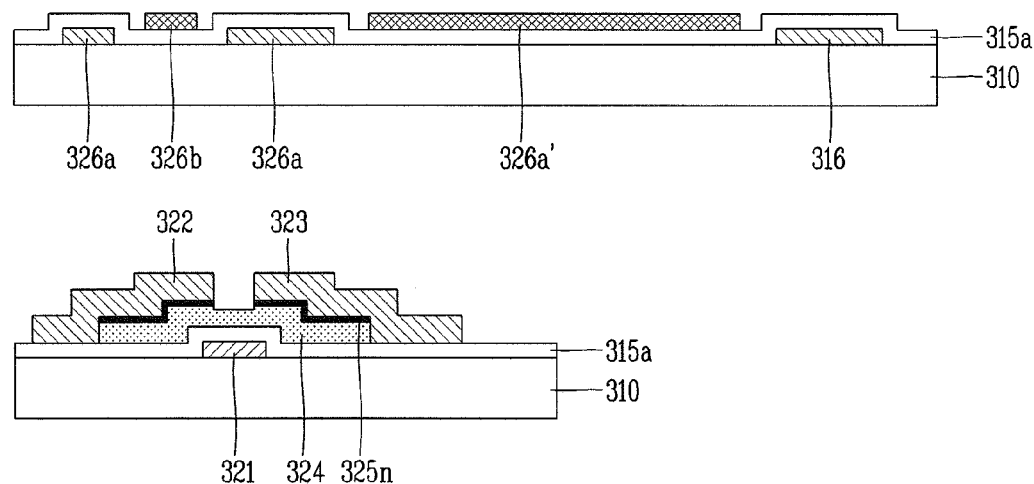

Thereafter, as shown in FIG. 13C, a second conductive film is formed on the entire surface of the array substrate 310 on which the active layer 324 and the n+ amorphous silicon thin film pattern 325 have been formed. Here, the second conductive film may be made of a low-resistance opaque conductive material such as aluminum (Al), an aluminum alloy, tungsten (W), copper (Cu), chromium (Cr), molybdenum (Mo), a molybdenum alloy, or the like. Also, the second conductive film may have a multi-layer structure in which two or more low-resistance conductive materials are stacked.

Thereafter, the n+ amorphous silicon thin film and the second conductive film are selectively removed through a photolithography (a third masking process) to form a source electrode 322 and a drain electrode 323 formed of the second conductive film at an upper portion of the active layer 324.

Meanwhile, a data line (not shown) formed of the second conductive film is formed in the data line region of the array substrate 310 and, at the same time, the second upper sub-link wiring 326b formed of the second conductive film and the first upper sub-link wiring 326a' formed of the second conductive film are formed in the non-display unit of the array substrate 310 through the third masking process.

The first lower and upper sub-link wirings 326a and 326a' and the second upper and lower sub-link wirings 326b and 326b' are alternately formed according to the order of the gate lines in the link unit 316, and in this case, the odd numbered gate lines in the link unit 316 may be connected to the first lower and upper sub-link wirings 326a and 326a' and the even numbered gate lines in the link unit 316 may be connected to the second upper and lower sub-link wirings 326b and 326b'.

In this case, an ohmic-contact layer 325n formed of the n+ amorphous silicon thin film and allowing the source/drain regions of the active layer 324 and the source/drain electrodes 322 and 323 to be in ohmic-contact is formed on the active layer 324.

Here, the case in which the active layer 324 and the data wiring layer, namely, the source electrode 322, the drain electrode 323, the data line, the second upper sub-link wiring 326b, and the first upper sub-link wiring 326a', are individually formed by performing the masking process twice is taken as an example, but the present invention is not limited thereto and the active layer 324 and the data wiring layer may be formed through a single masking process by using diffraction exposure or half-tone exposure.

Figure 13D:
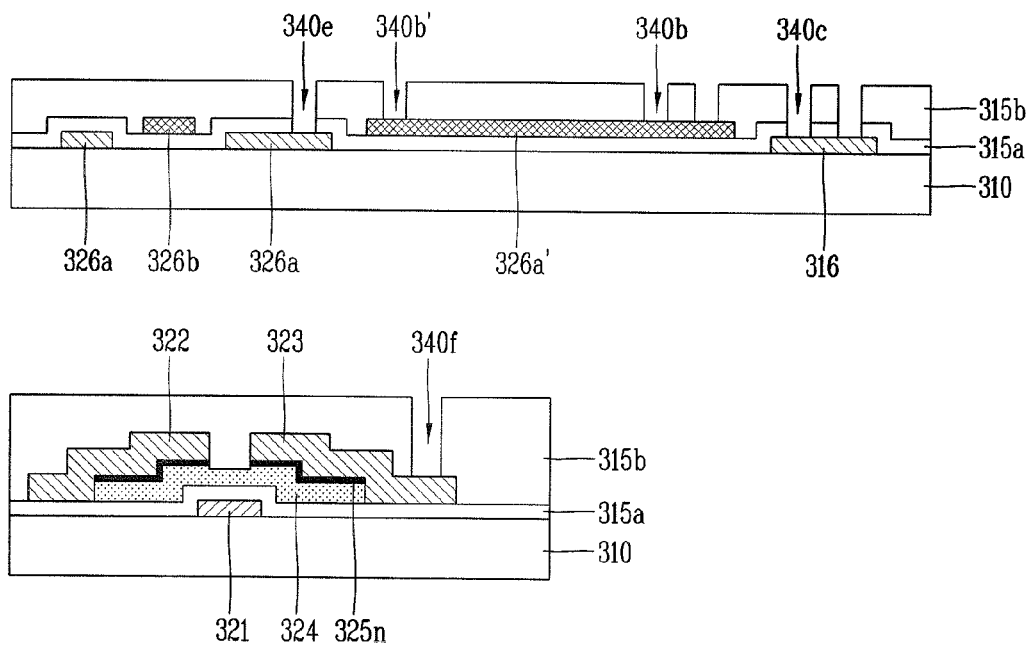

And then, as shown in FIG. 13D, a protection layer 315b is formed on the entire surface of the array substrate 310 on which the source/drain electrodes 322 and 323, the data line, the second upper sub-link wiring 326b, and the first upper sub-link wiring 326a' have been formed.

Through a photolithography process (a fourth masking process), the protection layer 315b and the gate insulating layer 315a are selectively removed to form a first contact hole 340a (see FIG. 11), a second contact hole 340b and 340b', a third contact hole 340c, a fourth contact hole 340d (see FIG. 11), and a fifth contact hole 340e, exposing portions of the second lower sub-link wiring 326b' in the gate wiring layer, the first upper sub-link wiring 326a', the gate line in the link unit 316, the second upper sub-link wiring 326b in the data wiring layer, and the first lower sub-link wiring 326a, respectively, in the non-display unit of the array substrate 310.

Also, through the fourth masking process, a sixth contact hole 340f, exposing a portion of the drain electrode 323, is formed in the display unit of the array substrate 310.

Here, the first to the sixth contact holes 340a-f may be formed such that the lower first conductive or second conductive film is exposed, or the lower first conductive film or second conductive film may be removed to expose lateral sides of the first and second conductive film.

Figure 13E:
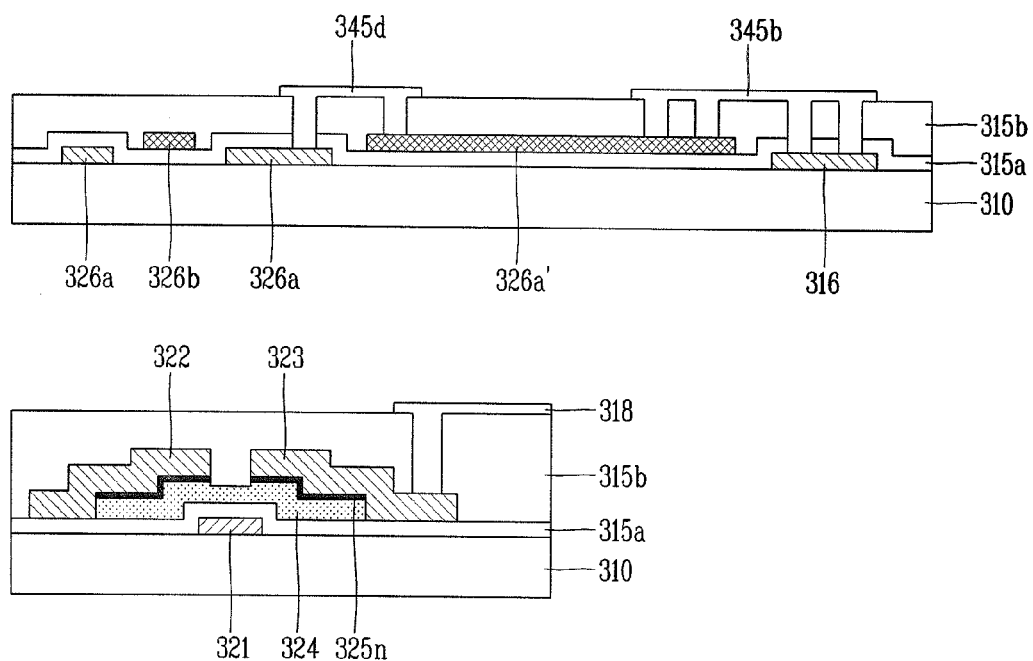

And then, as shown in FIG. 13E, a third conductive film made of a transparent conductive material is formed on the entire surface of the array substrate 310 with the protection layer 315b formed thereon, and then, selectively patterned by using a photolithography process (a fifth masking process) to form a pixel electrode 318 electrically connected to the drain electrode 323 through the sixth contact hole 340f in the pixel region of the array substrate 310.

Meanwhile, the third conductive film is selectively patterned by using the fifth masking process to form a first connection electrode 345a (see FIG. 11) electrically connected to the second lower sub-link wiring 326b' in the gate wiring layer and the gate line in the link unit 316 through the first contact hole 340a and the third contact hole 340c, respectively, and a third connection electrode 345c (see FIG. 11) electrically connected to the second lower sub-link wiring 326b' in the gate wiring layer and the second upper sub-link wiring 326b in the data wiring layer through another first contact hole 340a' and the fourth contact hole 340d, respectively. Accordingly, the second upper sub-link wiring 326b in the data wiring layer is electrically connected to the second lower sub-link wiring 326b' in the gate wiring layer through the third connection electrode 345c, and the second lower sub-link wiring 326b' in the gate wiring layer is electrically connected to the gate line in the link unit 316 through the first connection electrode 345a.

Also, by using the fifth masking process, the third conductive film is selectively patterned to form the second connection electrode 345b electrically connected to the first upper sub-link wiring 326a' and the gate line in the link unit 316 through the second contact hole 340b and the third contact hole 340c, and the fourth connection electrode 345d electrically connected to the first upper sub-link wiring 326a' and the first lower sub-link wiring 326a through the second contact hole 340b' and the fifth contact hole 340e, respectively. Accordingly, the first lower sub-link wiring 326a is electrically connected to the first upper sub-link wiring 326a' through the fourth connection electrode 345d, and the first upper sub-link wiring 326a' is electrically connected to the gate line in the link unit 316 through the second connection electrode 345b.

Here, the third connection electrode 345c and the fourth connection electrode 345d are formed in at least one point of the first lower and upper sub-link wiring set 326a and 326a' and at least one point of the second upper and lower sub-link wiring set 326b and 326b' respectively.

Meanwhile, in the third embodiment of the present invention, the case in which the link unit having a dual-link structure is formed at one side of the display unit is described as an example, but the present invention is not limited thereto. In an embodiment of the present invention, the link unit having a dual-link structure may be formed at both sides of the display unit, and this will be described in detail in a fourth embodiment of the present invention.

Figure 14:
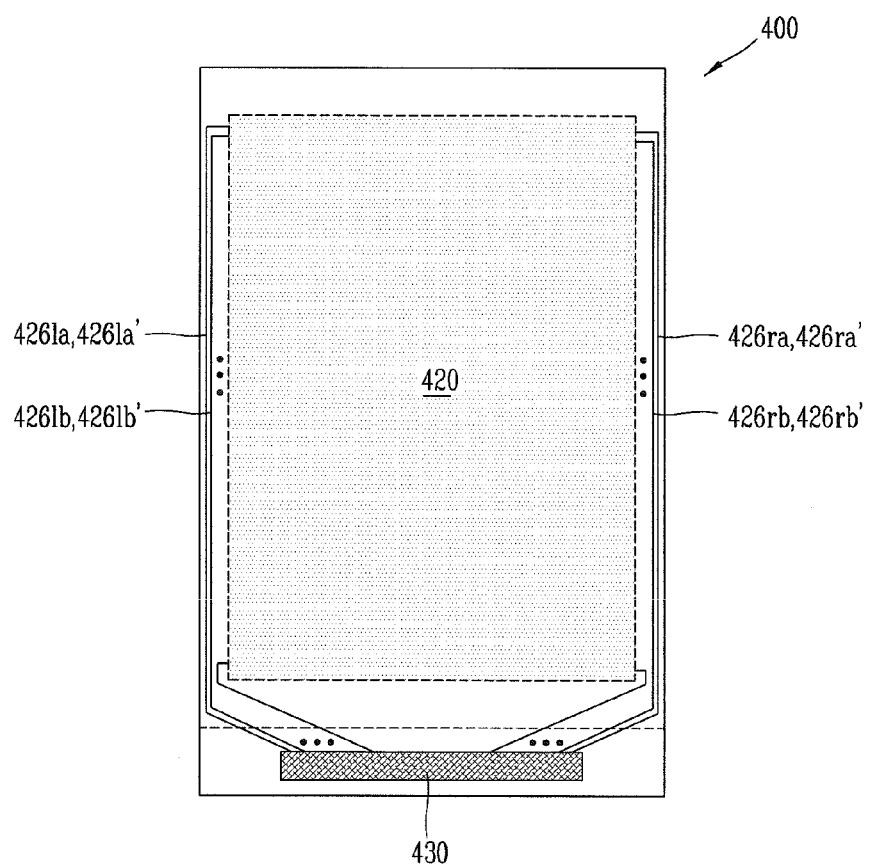
FIG. 14 is a plan view schematically showing a display device according to a fourth embodiment of the present invention.

FIG. 14 is a plan view schematically showing a display device according to a fourth embodiment of the present invention.

Figure 15:
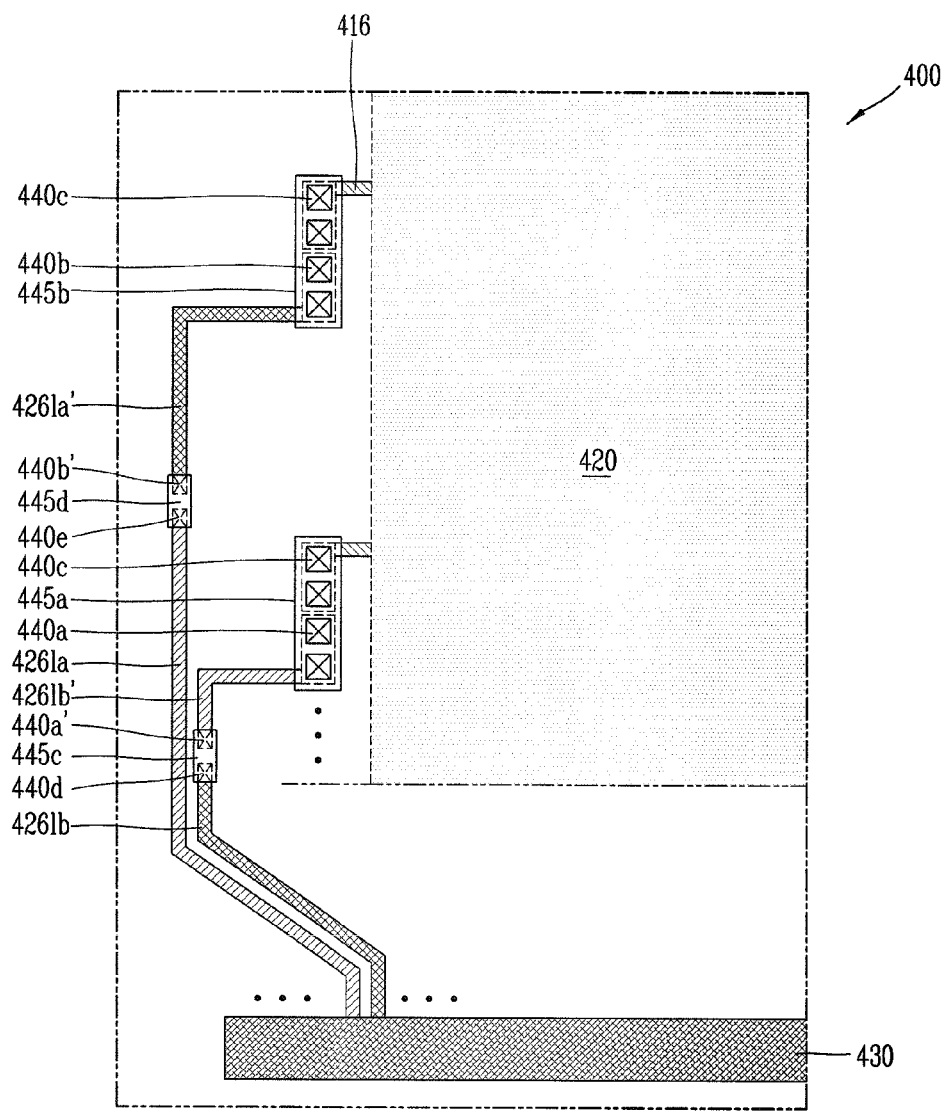
FIG. 15 is an enlarged plan view showing a portion of the display device illustrated in FIG. 14 according to the fourth embodiment of the present invention.

FIG. 15 is an enlarged plan view showing a portion of the display device illustrated in FIG. 14 according to the fourth embodiment of the present invention.

With reference to FIGS. 14 and 15, a display device 400 according to the fourth embodiment of the present invention includes a display unit 420 in which a plurality of sub-pixels (not shown) disposed in a matrix form, a non-display unit surrounding the display unit 420, and a driving unit for driving the sub-pixels.

The driving unit includes a timing driving unit (not shown), a data driving unit 430, a level shifter (not shown), and the like. Here, the data driving unit 430 is formed on a panel of the display device 400, and the timing driving unit may be formed on a flexible circuit board (not shown) connected to a panel or an external system substrate connected to the flexible circuit board, or the like. However, the present invention is not limited thereto and the timing driving unit may be formed together with the data driving unit 430.

The driving unit is mounted in the form of an integrated circuit (IC) on the panel, and the flexible circuit board is attached to the panel. Here, the panel and the flexible circuit board may be attached by an anisotropy conductive film (ACF).

Here, the display device 400 includes, for example, flat panel display devices such as an LCD device or an OLED display device.

When an LCD device is taken as an example of the display device 400, although not shown in detail, the panel of the display device 400 may include a color filter substrate as a first substrate, an array substrate as a second substrate, and a liquid crystal layer formed between the color filter substrate and the array substrate.

Here, the color filter substrate may include color filters including red, green, and blue sub-color filters, black matrices demarcating the subcolor filters and blocking light which transmits through the liquid crystal layer, and an overcoat layer formed on upper portions of the color filters and the black matrices.

Gate lines and data lines arranged vertically and horizontally to define pixel regions are formed on the array substrate, and thin film transistors as switching elements are formed at crossing regions, namely, TFT regions, of the gate lines and the data lines.

Here, the thin film transistor includes a gate electrode connected to the gate line, a source electrode connected to the data line, and a drain electrode connected to the pixel electrode. Also, the TFT includes a gate insulating layer for insulating the gate electrode and the source/drain electrodes, and an active layer for forming a conductive channel between the source and drain electrodes by a gate voltage supplied to the gate electrode. Also, the TFT includes a protection layer for insulating the source/drain electrodes and the pixel electrode.

The display device 400 according to the fourth embodiment of the present invention configured as described above requires a number of link wiring sets 426la,426la', 426lb, 426*lb'*, 426*ra*,426*ra'*, 426*rb*,426*rb'* corresponding to the gate lines in order to apply gate signals to the respective gate lines of the plurality of sub-pixels.

Here, the display device 400 according to the fourth embodiment of the present invention employs the dual-link structure in which a plurality sets of the link wirings 426*la*, 426*la'*, a plurality sets of the link wirings 426*lb*,426*lb'*, a plurality sets of the link wirings 426*ra*,426*ra'*, and a plurality sets of the link wirings 426*rb*,426*rb'* are formed by using the data wiring layer and the gate wiring layer in the similar manner to that of the first and second embodiments of the present invention as described above. That is to say, in the case of the fourth embodiment of the present invention, the first lower and upper sub-link wirings 426*la*,426*la'*, 426*ra*, 426*ra'* and the second upper and lower sub-link wirings 426*lb*,426*lb'*, 426*rb*,426*rb'* are alternately formed in the gate wiring layer and the data wiring layer such that the first sub-link wiring set 426*la*,426*la'* is adjacent to the second sub-link wiring set 426*lb*,426*lb'* and the first sub-link wiring set 426*ra*,426*ra'* is adjacent to the second sub-link wiring set 426*rb*,426*rb'*, so the space between the neighboring link wiring sets 426*la*,426*la'* and 426*lb*,426*lb'*, 426*ra*,426*ra'* and 426*rb*,426*rb'* can be reduced, and accordingly, the same number of link wiring sets 426*la*,426*la'*, 426*lb*,426*lb'*, 426*ra*, 426*ra'*, 426*rb*,426*rb'* can be arranged in a link unit with a total width smaller than that of the prior art.

However, like the second embodiment, in the fourth embodiment of the present invention, the first link wiring sets 426*la*,426*la'* and 426*ra*,426*ra'* and the second link wiring sets 426*lb*,426*lb'* and 426*rb*,426*rb'* are formed to include the link wirings 426*la'*,426*ra'*, 426*lb'*,426*rb'* of different layers from the link wirings 426*la*,426*ra*, 426*lb*,426*rb* formed in, respectively, through a line jumping structure, thus preventing a defective image due to a difference in resistance between the neighboring link wiring sets 426*la*,426*la'* and 426*lb*,426*lb'*, 426*ra*,426*ra'* and 426*rb*,426*rb'*. Namely, the first link wiring sets 426*la*,426*la'* and 426*ra*,426*ra'* may include the first link wirings 426*la*, 426*ra* in the gate wiring layer (i.e., first lower sub-link wirings) and the first link wirings 426*la'*, 426*ra'* in the data wiring layer (i.e., first upper sub-link wirings), and the second link wiring sets 426*lb*,426*lb'* and 426*rb*,426*rb'* may include the second link wirings 426*lb*, 426*rb* in the data wiring layer (i.e., second upper sub-link wirings) and the second link wirings 426*lb'*, 426*rb'* in the gate wiring layer (i.e., second lower sub-link wirings). Also, the first link wiring sets 426*la*,426*la'* and 426*ra*,426*ra'* may include the left first lower and upper sub-link wirings 426*la*, 426*la'* positioned at the left side and the right first lower and upper sub-link wirings 426*ra*, 426*ra'* positioned at the right side, and the second link wiring sets 426*lb*,426*lb'* and 426*rb*,426*rb'* may include left second upper and lower sub-link wirings 426*lb*, 426*lb'* and the right second upper and lower sub-link wirings 426*rb*, 426*rb'*.

Here, since the display device 400 according to the fourth embodiment employs the dual-link structure, contact holes 440*b* and 440*c* are required to connect the first upper sub-link wiring 426*la'*, 426*ra'* (it will be described based on the left link wirings for the sake of explanation) to the gate line in the link unit 416 (here, the gate line in the link unit 416 refers to the gate line of the display unit extending toward the non-display unit). Namely, the first upper sub-link wirings 426*la'*, 426*ra'* is electrically connected to an upper second connection electrode 445*b* through the second contact hole 440*b*, and the second connection electrode 445*b* is electrically connected to the lower gate line in the link unit 416 through the third contact hole 440*c*, and accordingly, the first upper sub-link wirings 426*la'*, 426*ra'* are connected to the corresponding gate line in the link unit 416. And, the first upper sub-link wirings 426*la'*, 426*ra'* are electrically connected to the first lower sub-link wirings 426*la*, 426*ra* in a different layer, through a fourth connection electrode 445*d*.

In this case, in the same manner, the second lower sub-link wirings 426*lb'*, 426*rb'* are also electrically connected to the upper first connection electrode 445*a* through the first contact hole 440*a* and the first connection electrode 445*a* is electrically connected to the lower gate line in the link unit 416 through the third contact hole 440*c*, and accordingly, the second lower sub-link wirings 426*lb'*, 426*rb'* are connected to the corresponding gate line in the link unit 416. And, the second lower sub-link wirings 426*lb'*, 426*rb'* are electrically connected to the second upper sub-link wirings 426*lb*, 426*rb* in a different layer, through the third connection electrode 445*c*.

Such line jumping is made in at least one point of each first lower and upper sub-link wiring set 426*la*,426*la'* and 426*ra*, 426*ra'* and at least one point of each second upper and lower sub-link wiring set 426*lb*,426*lb'* and 426*rb*,426*rb'*. Namely, the first lower and upper sub-link wiring sets 426*la*,426*la'* and 426*ra*,426*ra'* and the second upper and lower sub-link wiring sets 426*lb*,426*lb'* and 426*rb*,426*rb'* may line-jump at least one time in an appropriate point in order to adjust resistance thereof. Thus, deviations of resistance between the link wirings 426*la*,426*la'*, 426*lb*,426*lb'*, 426*ra*,426*ra'*, 426*rb*,426*rb'* are compensated for to thus improve a horizontal dim phenomenon in which colors of the respective lines on the screen are different.

The first lower and upper sub-link wiring sets 426*la*,426*la'* and 426*ra*,426*ra'* and the second upper and lower sub-link wiring sets 426*lb*,426*lb'* and 426*rb*,426*rb'* are alternately formed according to the order and horizontal order of the gate lines in the link unit 416, and in this case, for example, based on the left side, the odd numbered gate lines in the link unit 416 may be connected to the left first lower and upper sub-link wirings 426*la*, 426*la'* and the even numbered gate lines in the link unit 416 may be connected to the left second upper and lower sub-link wirings 426*lb*, 426*lb'*. Also, based on the right side, the odd numbered gate lines in the link unit 416 may be connected to the right first lower and upper sub-link wirings 426*ra*, 426*ra'* and the even numbered gate lines in the link unit 416 may be connected to the right second upper and lower sub-link wirings 426*rb*, 426*rb'*. However, the present invention is not limited to such a connection scheme.

The array substrates according to the first to fourth embodiments of the present invention are attached with color filter substrates in a facing manner by means of a sealant applied to outer edges of an image display part. In this case, the color filter substrates include black matrixes for preventing leakage of light to the TFTs, the gate lines and the data lines, and color filters for implementing red, green and blue colors.

The attachment of the color filter substrates and the array substrates are made through attachment keys formed on the color filter substrates or the array substrates.

The present invention may also be applied to any other display devices fabricated by using TFTs, for example, an OLED (Organic Light Emitting Diode) display device in which OLEDs are connected to driving transistors.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device, comprising:
a first substrate including a display unit and a non-display unit surrounding the display unit;
a driving unit,
wherein the first substrate further comprises:
a plurality of thin film transistors in the display unit; and
a plurality of first link wirings and a plurality of second link wirings alternately located in the non-display unit, and alternately connected to respective gate lines of the thin film transistors for applying gate signals from the driving unit to the respective gate lines;
a gate insulating layer covering the gate lines and the first link wirings;
an active layer of a thin film transistor;
data lines, source electrodes, and drain electrodes in the display unit;
a passivation layer covering the data lines, the source and drain electrodes, and the second link wirings;
contact holes exposing the gate lines, the first link wirings, the second link wirings, and the drain electrodes;
pixel electrodes connected to the drain electrodes; and
a second substrate attached to the first substrate,
wherein the first link wiring is adjacent to the second link wiring,
wherein the first link wiring is formed on a first layer, and
wherein the second link wiring is formed on a second layer different from the first layer.

2. The display device of claim 1, wherein:
gate lines are formed on the first layer; and
data lines are formed on the second layer.

3. The display device of claim 2, further comprising:
a first connection electrode electrically connecting the first link wiring and the gate line; and
a second connection electrode electrically connecting the second link wiring and the gate line.

4. The display device of claim 3, wherein the first connection electrode and the second connection electrode are made of a same material.

5. The display device of claim 3, wherein:
the first link wiring further comprises a first auxiliary link wiring; and
the second link wiring further comprises a second auxiliary link wiring.

6. The display device of claim 5, wherein:
the first auxiliary link wiring is parallel with the first link wiring and formed over the first link wiring; and
the second auxiliary link wiring is parallel with the second link wiring and formed over the second link wiring.

7. The display device of claim 6, wherein:
the first auxiliary link wiring is formed right above the first link wiring; and
the second auxiliary link wiring is formed right above the second link wiring.

8. The display device of claim 5, wherein the first auxiliary link wiring and the second auxiliary link wiring are formed on the same layer.

9. The display device of claim 5, wherein:
a width of the first auxiliary link wiring is narrower than a width of the first link wiring; and
a width of the second auxiliary link wiring is narrower than a width of the second link wiring.

10. The display device of claim 5, wherein the first auxiliary link wiring and the second auxiliary link wiring are formed of a transparent conductive material.

11. The display device of claim 8, wherein the first auxiliary link wiring and the second auxiliary link wiring are formed on the same layer that pixel electrodes are formed.

12. The display device of claim 8, wherein the first auxiliary link wiring and the second auxiliary link wiring are formed on the same layer that the first connection electrode and the second connection electrode are formed.

13. The display device of claim 5, wherein:
the first link wiring and the first auxiliary link wiring are connected with each other electrically; and
the second link wiring and the second auxiliary link wiring are connected with each other electrically.

14. The display device of claim 3, wherein:
the first link wiring comprises a first lower sub-link wiring formed on the first layer and a first upper sub-link wiring formed on the second layer; and
the second link wiring comprises a second lower sub-link wiring formed on the first layer and a second upper sub-link wiring formed on the second layer.

15. The display device of claim 14, wherein:
the first lower sub-link wiring and the first upper sub-link wiring are connected by a third connection electrode; and
the second lower sub-link wiring and the second upper sub-link wiring are connected by a forth connection electrode.

16. The display device of claim 14, wherein:
the first lower sub-link wiring and the second upper sub-link wiring are adjacent to each other and alternately formed; and
the first upper sub-link wiring and the second lower sub-link wiring are adjacent to each other and alternately formed.

17. The display device of claim 14, wherein:
the first lower sub-link wiring and the second lower sub-link wiring are formed on the same layer that the gate line is formed; and
the first upper sub-link wiring and the second upper sub-link wiring are formed on the same layer that the data line is formed.

18. A method for manufacturing a display device, the method comprising:
providing a first substrate including a display unit and an non-display unit surrounding the display unit;
forming gate lines in the display unit and a plurality of first link wirings in the non-display unit;
forming a gate insulating layer covering the gate lines and the first link wiring;
forming an active layer of a thin film transistor;
forming data lines, source electrodes, and drain electrodes in the display unit;
forming a plurality of second link wirings in the non-display unit;
forming a passivation layer covering the data lines, the source and drain electrodes, and the second link wiring;
forming contact holes exposing the gate lines, the first link wiring, the second link wiring, and the drain electrodes;
forming pixel electrodes connecting to the drain electrodes;
providing a second substrate; and
attaching the first substrate and the second substrate.

19. The method of claim 18, wherein:
the first link wiring and the second link wiring are alternately formed in the non-display unit; and
the first link wiring is adjacent to the second link wiring.

20. The method of claim 18, wherein the forming the pixel electrodes connecting to the drain electrodes further comprises forming connection electrodes respectively connecting:
the gate lines to the first link wiring; and
the gate lines to the second link wiring.

21. The method of claim 20, wherein the forming the pixel electrodes connecting to the drain electrodes further comprises respectively forming auxiliary link wirings over the first link wiring and the second link wiring.

22. The method of claim 21, wherein the auxiliary link wirings are formed of a same transparent conductive material as that of a pixel electrode.

23. A method for manufacturing a display device, the method comprising:
providing a first and a second substrates, the first substrate including a display unit and an non-display unit surrounding the display unit;
providing a driving unit;
forming gate lines in the display unit;
forming a plurality of first lower sub-link wirings and a plurality of second lower sub-link wirings in the non-display unit;
forming a gate insulating layer covering the gate lines, the first lower sub-link wirings, and the second lower sub-link wirings;
forming an active layer of a thin film transistor;
forming data lines, source electrodes, and drain electrodes in the display unit;
forming a plurality of first upper sub-link wirings and a plurality of second upper sub-link wirings in the non-display unit;
forming a passivation layer covering the data lines, the source and drain electrodes, the first upper sub-link wirings, and the second upper sub-link wirings;
forming contact holes exposing the gate lines, the first lower sub-link wirings, second lower sub-link wirings, the first upper sub-link wirings, and the second upper sub-link wirings;
forming pixel electrodes connecting to the drain electrodes and connection electrodes connecting the corresponding gate lines to the first upper sub-link wirings respectively, the corresponding gate lines to the second lower link-wirings respectively, the first lower sub-link wirings to the first upper sub-link wirings respectively and the second lower sub-link wirings to the second upper sub-link wirings respectively; and
attaching the first substrate and the second substrate.

24. The method of claim 23, wherein the first lower sub-link wirings and the second lower sub-link wirings are isolated from each other on the same layer.

25. The method of claim 23, wherein the first upper sub-link wirings and the second upper sub-link wirings are isolated from each other on the same layer.

26. The method of claim 23, wherein:
the first lower sub-link wirings and the second upper sub-link wirings are adjacent to each other and alternately formed; and
the first upper sub-link wirings and the second lower sub-link wirings are adjacent to each other and alternately formed.

* * * * *